United States Patent
Arai et al.

(10) Patent No.: US 9,041,049 B2
(45) Date of Patent: May 26, 2015

(54) POWER JFET

(71) Applicant: Renesas Electronics Corporation, Kawasaki-shi, Kanagawa (JP)

(72) Inventors: Koichi Arai, Kanagawa (JP); Yasuaki Kagotoshi, Kanagawa (JP); Nobuo Machida, Kanagawa (JP); Natsuki Yokoyama, Mitaka (JP); Haruka Shimizu, Kodaira (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/970,586

(22) Filed: Aug. 19, 2013

(65) Prior Publication Data
US 2013/0334542 A1    Dec. 19, 2013

Related U.S. Application Data

(62) Division of application No. 13/363,256, filed on Jan. 31, 2012, now Pat. No. 8,524,552.

(30) Foreign Application Priority Data

Feb. 1, 2011   (JP) .................. 2011/019438

(51) Int. Cl.
*H01L 29/66*   (2006.01)
*H01L 29/36*   (2006.01)
(Continued)

(52) U.S. Cl.
CPC .............. *H01L 29/36* (2013.01); *H01L 29/045* (2013.01); *H01L 29/1066* (2013.01); *H01L 29/1608* (2013.01); *H01L 29/42316* (2013.01); *H01L 29/66909* (2013.01); *H01L 29/8083* (2013.01)

(58) Field of Classification Search
USPC ............ 257/E29.265, E29.313, 77, 134, 302, 257/328, 330
See application file for complete search history.

(56) References Cited

U.S. PATENT DOCUMENTS 6,770,539 B2    8/2004    Sumida
6,900,490 B2    5/2005    Asao et al.
(Continued)

FOREIGN PATENT DOCUMENTS

EP    0 890 186 B1    1/2006
JP    2000-507935 A   6/2000
(Continued)

OTHER PUBLICATIONS

Office Action dated Oct. 16, 2014, in Japanese Patent Application No. 2011-019438.

*Primary Examiner* — Asok K Sarkar
(74) *Attorney, Agent, or Firm* — Miles & Stockbridge P.C.

(57) ABSTRACT

In general, in a semiconductor active element such as a normally-off JFET based on SiC in which an impurity diffusion speed is significantly lower than in silicon, gate regions are formed through ion implantation into the side walls of trenches formed in source regions. However, to ensure the performance of the JFET, it is necessary to control the area between the gate regions thereof with high precision. Besides, there is such a problem that, since a heavily doped PN junction is formed by forming the gate regions in the source regions, an increase in junction current cannot be avoided. The present invention provides a normally-off power JFET and a manufacturing method thereof and forms the gate regions according to a multi-epitaxial method which repeats a process including epitaxial growth, ion implantation, and activation annealing a plurality of times.

3 Claims, 12 Drawing Sheets

(51) Int. Cl.
  *H01L 29/04*  (2006.01)
  *H01L 29/10*  (2006.01)
  *H01L 29/16*  (2006.01)
  *H01L 29/423* (2006.01)
  *H01L 29/808* (2006.01)

(56) References Cited

U.S. PATENT DOCUMENTS

| | | |
|---|---|---|
| 6,969,887 B2 | 11/2005 | Mizukami et al. |
| 7,473,929 B2 | 1/2009 | Kusumoto et al. |
| 7,709,862 B2 | 5/2010 | Nonaka et al. |
| 7,745,894 B2 | 6/2010 | Asao et al. |
| 7,855,384 B2 | 12/2010 | Yamamoto et al. |
| 7,932,572 B2 | 4/2011 | Tsujiuchi |
| 2002/0139992 A1 | 10/2002 | Kumar et al. |
| 2004/0079989 A1 | 4/2004 | Kaneko et al. |
| 2005/0045892 A1 | 3/2005 | Hayashi et al. |
| 2006/0097267 A1 | 5/2006 | Kumar et al. |
| 2006/0102908 A1 | 5/2006 | Imai et al. |
| 2006/0120147 A1 | 6/2006 | Peng et al. |
| 2008/0073710 A1 | 3/2008 | Yamamoto |
| 2008/0153216 A1 | 6/2008 | Kumar et al. |
| 2010/0308343 A1 | 12/2010 | Suzuki et al. |
| 2011/0147766 A1 | 6/2011 | Tarui |

FOREIGN PATENT DOCUMENTS

| | | |
|---|---|---|
| JP | 2002-329729 A | 11/2002 |
| JP | 2003-69043 A | 3/2003 |
| JP | 2004-296869 A | 10/2004 |
| JP | 2005-39257 A | 2/2005 |
| JP | 2005-236267 A | 9/2005 |
| JP | 2007-42803 A | 2/2007 |
| JP | 2008-66619 A | 3/2008 |
| JP | 2008-130995 A | 6/2008 |
| JP | 2009-194210 A | 8/2009 |

POWER JFET

CROSS-REFERENCE TO RELATED APPLICATIONS

The disclosure of Japanese Patent Application No. 2011-19438 filed on Feb. 1, 2011 including the specification, drawings and abstract is incorporated herein by reference in its entirety.

BACKGROUND

The present invention relates to a technology which is effective when applied to a device formation technique in a semiconductor device (or semiconductor integrated circuit device) and a manufacturing method thereof, i.e., particularly in a normally-off power JFET and a manufacturing method thereof.

Japanese Unexamined Patent Publication No. 2008-66619 (Patent Document 1) discloses a Multi-Epitaxy technique in which, as a manufacturing process of a Normally-ON JFET (Junction Field Effect Transistor), epitaxial growth and ion implantation into portions serving as gates are repeated several times, and then activation annealing is simultaneously performed.

RELATED ART DOCUMENT

Patent Document

[Patent Document 1]
Japanese Unexamined Patent Publication No. 2008-66619

SUMMARY

In general, in a semiconductor active element such as a Normally-OFF JFET based on SiC in which an impurity diffusion speed is significantly lower than in silicon, trenches are formed in gate regions, and ion implantation into the side walls thereof or the like is performed to form the gate regions. However, the study conducted by the present inventors on such an element has revealed that there are problems as shown below. That is, for example, (1) To ensure the performance of a JFET, it is necessary to control the area between the gate regions thereof with high precision.

(2) Since each of the gate regions is formed in a source region under process constraints, a heavily doped PN junction is formed between the source region and the gate region so that an increase in junction current cannot be avoided.

(3) Particularly high-energy ion implantation is required for edge termination.

(4) Since it is difficult to achieve electrode wiring immediately above the gate region, the gate resistance increases.

The present invention has been achieved to solve such problems.

An object of the present invention is to provide a structure of a semiconductor device such as a highly reliable SiC-based JFET and a manufacturing process thereof.

The above and other objects and novel features of the present invention will become apparent from a statement in the present specification and the accompanying drawings.

The following is a brief description of the outline of a representative embodiment of the invention disclosed in the present application.

That is, an aspect of the present invention is a normally-off power JFET and a manufacturing method thereof and, according to a multi-epitaxial method which repeats a process including epitaxial growth, ion implantation, and activation annealing a plurality of times, a gate region including a plurality of areas is formed.

The following is a brief description of an effect obtained according to the representative embodiment of the invention disclosed in the present application.

That is, in a normally-off power JFET and a manufacturing method thereof, according to a multi-epitaxial method which repeats a process including epitaxial growth, ion implantation, and activation annealing a plurality of times, a gate region including a plurality of areas is formed. This allows high-precision setting of a gate-to-gate spacing.

DETAILED DESCRIPTION

Outline of Embodiment

Figure 1:
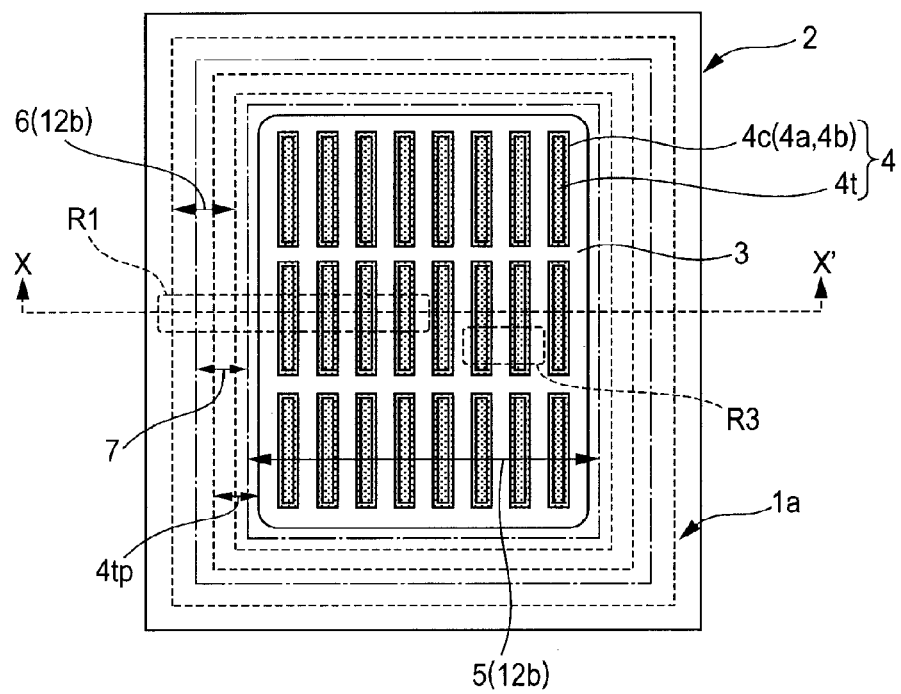
FIG. 1 is a chip top view of an example of a target device in a manufacturing method of a normally-off power JFET of an embodiment of the present invention.

First, a description will be given to the outline of a representative embodiment of the invention disclosed in the present application.

1. A method of manufacturing a normally-off power JFET includes the steps of: (a) providing a semiconductor wafer having, in a first main surface of a silicon-carbide-based semiconductor substrate having a first conductivity type, a first silicon-carbide-based semiconductor epitaxial layer having the same conductivity type as the first conductivity type and a concentration lower than that of the semiconductor substrate; (b) doping a surface of the first silicon-carbide-based semiconductor epitaxial layer corresponding to the first main surface of the semiconductor wafer with an impurity having a second conductivity type by ion implantation to introduce, into the surface of the first, epitaxial layer, a plurality of first gate impurity regions; (c) after the step (b), performing first activation annealing on the first main surface of the wafer; (d) after the step (c), forming, in the surface of the first epitaxial layer corresponding to the first main surface of the semiconductor wafer, a second silicon-carbide-based semiconductor epitaxial layer having the same conductivity type as the first conductivity type and a concentration lower than that of the semiconductor substrate; (e) doping a surface of the second silicon-carbide-based semiconductor epitaxial layer corresponding to the first main surface of the semiconductor wafer with an impurity having the same conductivity type as the second conductivity type by ion implantation to introduce, into the surface of the second epitaxial layer, a plurality of second gate impurity regions coupled to the individual first gate impurity regions to form gate impurity regions; and (f) after the step (e), performing second activation annealing on the first main surface of the wafer.

2. In the method of manufacturing a normally-off power JFET according to article 1, the first activation annealing and the second activation annealing are each performed in a state where the first main surface of the semiconductor wafer is covered with a carbon-based film.

3. In the method of manufacturing a normally-off power JFET according to article 1 or 2, the power JFET is of a vertical type.

4. In the method of manufacturing a normally-off power JFET according to any one of articles 1 to 3, a polytype of the silicon-carbide-based semiconductor substrate is 4H.

5. In the method of manufacturing a normally-off power JFET according to any one of articles 1 to 4, a crystal plane of the first main surface is a (0001) plane or a plane equivalent thereto.

6. The method of manufacturing a normally-off power JFET according to any one of articles 1 to 5 further includes the steps of: (g) after the step (f), forming, in the first main surface of the semiconductor wafer, a third silicon-carbide-based semiconductor epitaxial layer having the same conductivity type as the first conductivity type and a concentration lower than that of the semiconductor substrate; (h) doping a surface of the third silicon-carbide-based semiconductor epitaxial layer corresponding to the first main surface of the semiconductor wafer with an impurity having the same conductivity type as the second conductivity type by ion implantation to introduce, into the surface of the third epitaxial layer, a plurality of third gate impurity regions forming the gate impurity regions together with the individual second gate impurity regions; and (i) after the step (h), performing third activation annealing on the first main surface of the wafer.

7. In the method of manufacturing a normally-off power JFET according to article 6, a spacing between the third gate impurity regions is larger than a spacing between the second gate impurity regions.

8. In the method of manufacturing a normally-off power JFET according to article 6 or 7, the third activation annealing is performed in a state where the first main surface of the semiconductor wafer is covered with a carbon-based film.

9. The method of manufacturing a normally-off power JFET according to any one of articles 6 to 8 further includes the step of: (j) after the step (i) and after removal of the carbon-based film, forming a metal gate electrode and a metal source electrode over the first main surface of the semiconductor wafer.

10. In the method of manufacturing a normally-off power JFET according to article 9, the metal gate electrode and the metal source electrode are formed over the surface of the third silicon-carbide-based semiconductor epitaxial layer.

11. In the method of manufacturing a normally-off power JFET according to any one of articles 1 to 10, the power JFET has, as an edge termination structure, a ring-like edge termination impurity area having the same conductivity type as the second conductivity type and surrounding a periphery of an active region.

12. In the method of manufacturing a normally-off power JFET according to any one of articles 1 to 11, the silicon-carbide-based semiconductor substrate is a SiC semiconductor substrate.

13. In the method of manufacturing a normally-off power JFET according to any one of articles 1 to 12, the silicon-carbide-based semiconductor substrate is an N-type substrate.

14. In the method of manufacturing a normally-off power JFET according to any one of articles 1 to 13, each of the gate impurity regions has a substantially linear two-dimensional shape.

15. In the method of manufacturing a normally-off power JFET according to any one of articles 1 to 13, each of the gate impurity regions has a substantially dot-like two-dimensional shape.

16. The method of manufacturing a normally-off power JFET according to any one of articles 6 to 14 further includes the step of: (k) after the step (i), forming a metal drain electrode over a second main surface of the semiconductor wafer opposite to the first main surface.

17. In the method of manufacturing a normally-off power JFET according to any one of articles 1 to 4 and 6 to 16, a crystal plane of the first main surface is a plane tilted by an angle of about not more than 10 degrees from a (0001) plane in a [1, 1, −2, 0] direction or a plane equivalent thereto.

18. In a normally-off power JFET including a silicon-carbide-based semiconductor substrate having a first main surface having a first conductivity type, the silicon-carbide-based semiconductor substrate includes: a first silicon-carbide-based semiconductor epitaxial layer having the same conductivity type as the first conductivity type and a concentration lower than that of the silicon-carbide-based semiconductor substrate; a second silicon-carbide-based semiconductor epitaxial layer having the same conductivity type as the first conductivity type and a concentration lower than that of the semiconductor substrate and provided in a surface of the first silicon-carbide-based semiconductor epitaxial layer corresponding to the first main surface of the semiconductor wafer; a plurality of first gate impurity regions doped with an impurity having a second conductivity type and provided in the first silicon-carbide-based semiconductor epitaxial layer; and a plurality of second gate impurity regions doped with an impurity having the second conductivity type and provided in the second silicon-carbide-based semiconductor epitaxial layer. In the normally-off power JFET, the first gate impurity regions and the second gate impurity regions are continuously aligned.

19. In the normally-off power JFET according to article 18, the first gate impurity regions are formed by doping the surface of the first silicon-carbide-based semiconductor epitaxial layer with the impurity having the second conductivity type by ion implantation and performing first activation annealing thereon, and the second gate impurity regions are formed by doping a surface of the second silicon-carbide-based semiconductor epitaxial layer with the impurity having the second conductivity type by ion implantation and performing second activation annealing thereon.

20. In the normally-off power JFET according to article 19, the first activation annealing and the second activation annealing are each performed in a state where the first main surface of the semiconductor wafer is covered with a carbon-based film.

21. In the normally-off power JFET according to any one of articles 18 to 20, a crystal plane of the first main surface is a plane tilted by an angle of about not more than 10 degrees from a (0001) plane in a [1, 1, −2, 0] direction or a plane equivalent thereto.

[Explanation of Description Form, Basic Terminology, and Use Thereof in Present Application]

1. In the present application, if necessary for the sake of convenience, the description of an embodiment may be such that the embodiment is divided into a plurality of sections in the description thereof. However, they are by no means independent of or distinct from each other unless particularly explicitly described otherwise, and one of the individual sections of a single example is details, variations, and so forth of part or the whole of the others. In principle, a repeated description of like parts will be omitted. Each constituent element in the embodiment is not indispensable unless particularly explicitly described otherwise, unless the constituent element is theoretically limited to a given number, or unless it is obvious from the context that the constituent element is indispensable.

Also in the present application, when a "semiconductor chip", "semiconductor device", or "semiconductor integrated circuit device" is mentioned, it primarily refers to various stand-alone transistors (active elements) and to a device in which a resistor, a capacitor, a diode, and the like are integrated around such a stand-alone transistor over a semiconductor chip or the like (examples of a material for the semiconductor chip include a single-crystal SiC substrate, a single-crystal silicon substrate, a composite substrate thereof, and the like. As a crystal polymorph of SiC, 4H—SiC is primarily referred to, but it will be appreciated that another crystal polymorph may also be referred to).

In the present application, when an "electronic circuit device" is mentioned, it indicates a semiconductor chip, a semiconductor device, a semiconductor integrated circuit device, a resistor, a capacitor, a diode, or the like and an interconnected system thereof.

Here, representative examples of the various transistors that can be shown include a junction FET (Field Effect Transistor).

In these days, each of the source and gate metal electrodes of a power-type electronic circuit device, semiconductor device, or semiconductor integrated circuit device is normally and mostly formed of one layer which is, e.g., an aluminum-based (or refractory-metal-based, e.g., tungsten-based) wiring layer M1 or two layers which are aluminum-based (or refractory-metal-based, e.g., tungsten-based) wiring layers M1 and M2. Note that, as such wiring layers, copper-based wiring layers are used occasionally.

2. Likewise, even when such wording as "X comprised of A" is used in association with a material, a composition, or the like in the description of the embodiment or the like, it does not exclude a material, a composition, or the like which contains an element other than A as one of the main constituent elements thereof unless particularly explicitly described otherwise or unless it is obvious from the context that it excludes such a material, composition, or the like. For example, when a component is mentioned, the wording means "X containing A as a main component" or the like. It will be appreciated that, even when, e.g., a "silicon member", "SiC (silicon carbide) member", or the like is mentioned, it is not limited to pure silicon or SIC, and a member containing a multi-element semiconductor containing silicon or SiC as a main component, another additive, or the like is also included. Likewise, it will also be appreciated that, even when a "silicon oxide film", "silicon-oxide-based insulating film", or the like is mentioned, it includes not only a relatively pure Undoped Silicon Dioxide, but also a thermal oxide film of FSG (Fluorosilicate Glass), TEOS-based silicon oxide, SiOC (Silicon Oxicarbide), Carbon-doped Silicon oxide, OSG (Organosilicate glass), PSG (Phosphorus Silicate Glass), BPSG (Borophosphosilicate Glass), or the like, a CVD oxide film, a coated silicon oxide such as SOG (Spin ON Glass) or NCS (Nano-Clustering Silica), a silica-based Low-k insulating film (porous insulating film) obtained by introducing voids into the same member as mentioned above, a composite film with another silicon-based insulating film which contains any of these mentioned above as a main constituent element thereof, and the like.

As a silicon-based insulating film commonly used in a semiconductor field along with a silicon-oxide-based insulating film, there is a silicon-nitride-based insulating film. Materials belonging to this system include SiN, SiCN, SiNH, SiCNH, and the like. Here, when "silicon nitride" is mentioned, it includes both of SiN and SiNH unless particularly explicitly described otherwise. Likewise, when "SiCN" is mentioned, it includes both of SiCN and SiCNH unless particularly explicitly described otherwise.

3. Likewise, it will also be appreciated that, although a preferred example is shown in association with a graphical figure, a position, an attribute, or the like, the graphical figure, position, attribute, or the like is not strictly limited thereto unless particularly explicitly described otherwise or unless it is obvious from the context that the graphical figure, position, attribute, or the like is strictly limited thereto.

4. Further, when a specific numerical value or numerical amount is mentioned, it may be a value more or less than the specific numerical value unless particularly explicitly described otherwise, unless the numerical value is theoretically limited to a given number, or unless it is obvious from the context that the numeral value is limited to a given number.

5. When a "wafer" is mentioned, it typically refers to a single-crystal silicon carbide wafer, a single-crystal silicon wafer, or the like over which a semiconductor integrated circuit device (the same as a semiconductor device or an electronic device) is formed. However, it will be appreciated that the "wafer" also includes a composite wafer of an insulating substrate and a semiconductor layer or the like, such as an epitaxial wafer or an LCD glass substrate.

6. In the present application, when an "ordinary temperature" or "room temperature" is mentioned, it commonly refers to a temperature of, e.g., about 25° C. or a range of, e.g., about 15° C. to about 35° C.

DETAILS OF EMBODIMENT

An embodiment will be described in greater detail. In each of the drawings, the same or like parts are designated by the same or similar marks or reference numerals, and a description thereof will not be repeated in principle.

In the accompanying drawings, hatching or the like may be omitted even in a cross section when hatching or the like results in complicated illustration or when the distinction between a portion to be hatched and a vacant space is distinct. In relation thereto, even a two-dimensionally closed hole may have a background outline thereof omitted when it is obvious from the description or the like that the hole is two-dimensionally closed, and so forth. On the other hand, even though not shown in a cross section, a portion other than a vacant space may be hatched to clearly show that the hatched portion is not a vacant space.

1. Description of Structure of Target Device, etc. in Manufacturing Method of Normally-Off Power JFET of Embodiment of Present Invention (See Mainly FIGS. 1 to 3, 22, and 24)

Note that, here, to give a specific description, a device having a source/drain breakdown voltage of about 800 to 1000 V is assumed and described.

Figure 2:
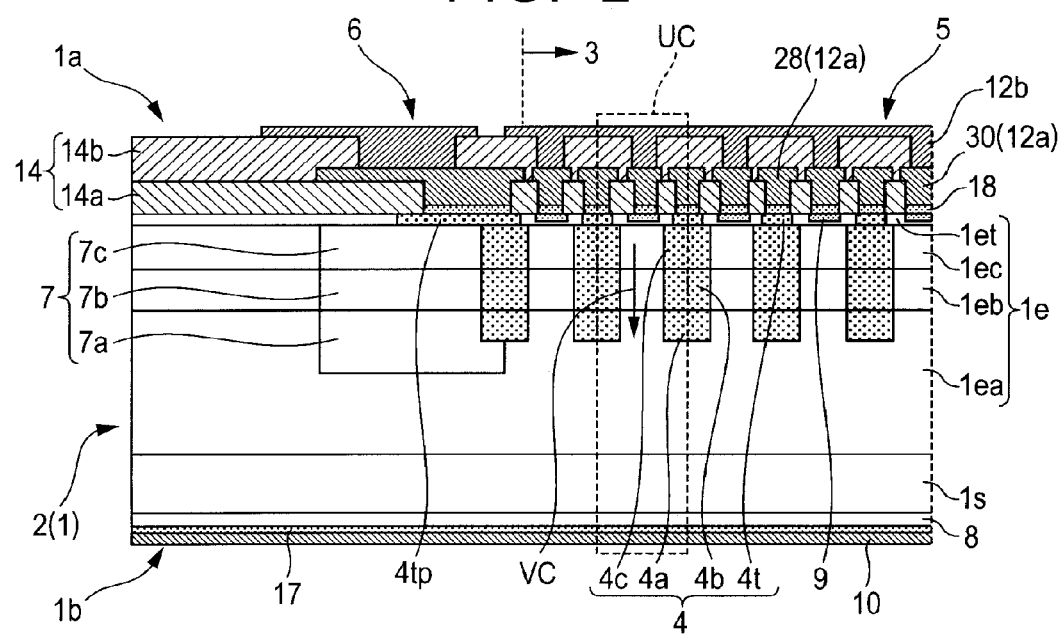
FIG. 2 is a schematic device cross-sectional view substantially corresponding to the X-X' cross section of a cut-away region R1 of the cell portion and peripheral portion of FIG. 1 (or FIG. 24)
Figure 3:
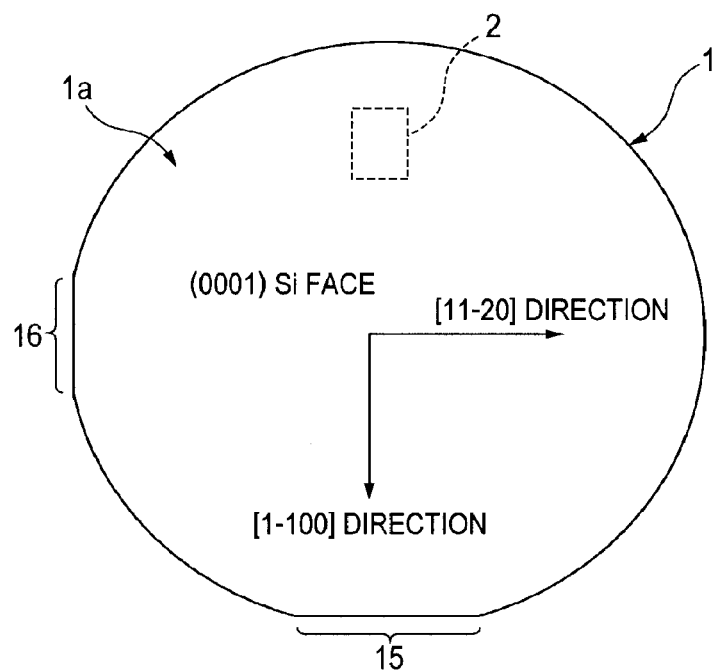
FIG. 3 is a wafer top view showing relations among a two-dimensional structure of a SiC wafer used in the manufacturing method of the normally-off power JFET of the embodiment of the present invention, a chip region corresponding to the chip of FIG. 1, and the crystal orientation of the wafer.
Figure 22:
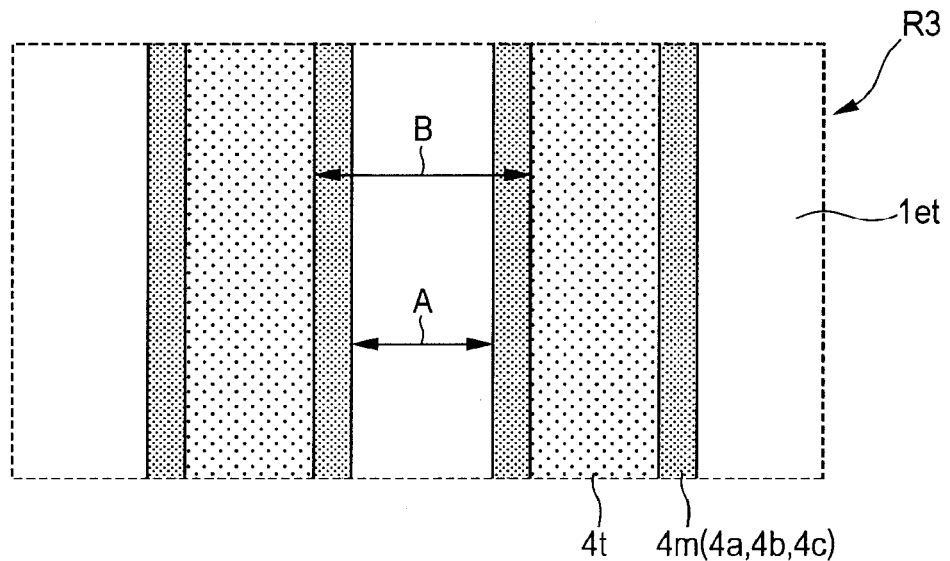
FIG. 22 is an enlarged plan view of a local cut-away region R3 of the cell portion of FIG. 1.
Figure 24:
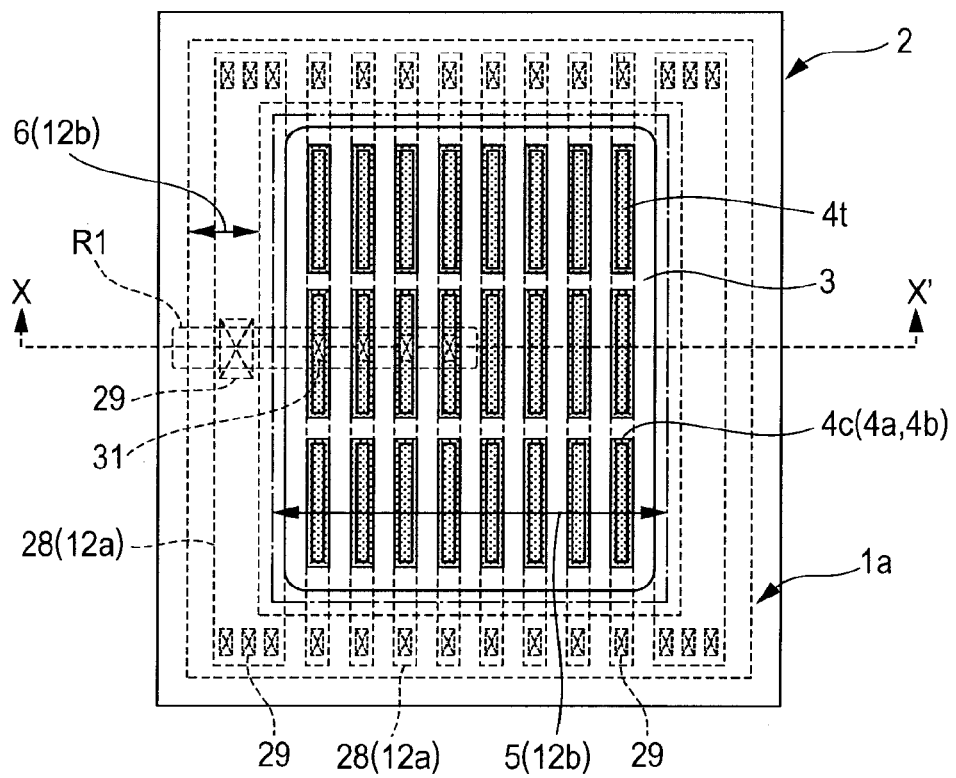
FIG. 24 is a chip top view of an example of the target device in the manufacturing method of the normally-off power JFET of the embodiment of the present invention, which is similar to FIG. 1 and schematically shows the relations among a plurality of metal layer, while diffusion regions or the like unrelated to the description are omitted therefrom.

FIG. 1 is a chip top view of an example of a target device in a manufacturing method of a normally-off power JFET of an, embodiment of the present invention. FIG. 2 is a schematic device cross-sectional view substantially corresponding to the X-X' cross section of a cut-away region R1 of the cell portion and peripheral portion of FIG. 1 (or FIG. 24). FIG. 3 is a wafer top view showing relations among a two-dimensional structure of a SiC wafer used in the manufacturing method of the normally-off power JFET of the embodiment of the present invention, a chip region corresponding to the chip of FIG. 1, and the crystal orientation of the wafer. FIG. 22 is an enlarged plan view of a local cut-away region R3 of the cell portion of FIG. 1. FIG. 24 is a chip top view of an example of the target device in the manufacturing method of the normally-off power JFET of the embodiment of the present invention, which is similar to FIG. 1 and schematically shows the relations among a plurality of metal layer, while diffusion regions or the like unrelated to the description are omitted therefrom. Based on these drawings, a description will be given to a structure of the target device and so forth in the manufacturing method of the normally-off power JFET of the embodiment of the present invention.

First, as shown in FIG. 1, in the same manner as in a silicon-based semiconductor device, a semiconductor chip 2 (SIC chip) shows a rectangular shape which is substantially square. In the middle portion of a top-side main surface 1a (first main surface) thereof, an active cell region 3 is provided. In the active cell region 3, a plurality of P+ gate regions 4 are provided in a matrix configuration. Each of the P+ gate regions 4 includes a lower-layer P+ gate region 4a (first gate impurity region), a middle-layer P+ gate region 4b (second gate impurity region), an upper-layer P+ gate region 4c, or the like, and an uppermost-layer P+ gate region 4t (third gate impurity region). The upper surface of the active cell region 3 is covered with a metal source electrode 5 forming a part of, e.g., an upper metal electrode layer 12b. Outside the active cell region 3, a metal gate electrode 6 (including a gate pad) forming a part of the upper metal electrode layer 12b and showing, e.g., a ring shape is provided. Also, outside the active cell region 3, an uppermost-layer P+ gate lead-out region 4tp is provided so as to come in contact therewith and, e.g., a ring-like P+ edge termination area 7 is provided so as to partly overlap the uppermost-layer P+ gate lead-out region 4tp and surround the active cell region 3.

Next, based on FIG. 24, a two-layer wiring structure (metal two-layer electrode structure) will be described. As shown in FIG. 24, a metal wiring structure over the top-side main surface 1a of the semiconductor chip 2 includes, e.g., a lower metal electrode layer 12a and an upper metal electrode layer 12b. The lower metal electrode layer 12a and the upper metal electrode layer 12b are coupled to each other by metal interlayer coupling portions 29 between first & second layers. The P+ gate regions 4 (actually, all the P+ gate regions 4 are provided with respective gate contact portions 31, of which only some are shown to avoid complicated illustration) are coupled individually to gate lead-out metal wires 28 each forming a part of the lower metal electrode layers 12a via top-surface nickel silicide films 18 (FIG. 2) of the gate contact portions 31. Each of the gate lead-out metal wires 28 are coupled to the metal gate electrode 6 as a part of the upper metal electrode layer 12b via the metal interlayer coupling portions 29 between first & second layers.

Next, based on FIG. 2 (the X-X' cross section of FIG. 1 or 24), a vertical structure of the device and so forth will be described. As shown in FIG. 2, the semiconductor chip 2 has an N-type semiconductor substrate is (N-type SiC substrate) as a base member. In the surface area of a back-side main surface 1b (second main surface) thereof, an N+ heavily doped drain layer 8 is provided by ion implantation or the like. Over the back surface 1b of the chip 2, a back-surface metal drain electrode 10 is formed via a back-surface nickel silicide film 17.

On the other side, in the top surface 1a of the N-type SiC substrate 1s, an N-type SiC epitaxial layer 1e including a lower N– epitaxial layer 1ea (first silicon-carbide-based semiconductor epitaxial layer), a middle N– epitaxial layer 1eb (second silicon-carbide-based semiconductor epitaxial layer), an upper N– epitaxial layer 1ec, an uppermost N– epitaxial layer 1et (third silicon-carbide-based semiconductor epitaxial layer), and the like is provided. Over the top-side main surface 1a of the N-type SiC substrate is above the N-type SiC epitaxial layer 1e, an interlayer insulating film 14 including a lower-layer interlayer insulating film 14a, an upper-layer interlayer insulating film 14b, and the like is provided. Between the lower-layer interlayer insulating film 14a and the upper-layer interlayer insulating film 14b, the lower metal electrode layers 12a (including the gate lead-out metal wires 28, the source lead-out metal wires 30, and the like) are provided and coupled to the substrate portion of the semiconductor chip 2 via contact holes, while being coupled to the upper metal electrode layer 12b (including the metal source electrode 5, the metal gate electrode 6, and the like) via coupling holes. In the surface area (surface area of the uppermost N– epitaxial layer 1et) of the N-type SiC epitaxial layer 1e, a plurality of N+ source regions 9 are provided. Between the N+ source regions 9, the P+ gate regions 4 (which are the uppermost-layer P+ gate regions 4t in the uppermost N– epitaxial layer 1e) are provided. Inside the N– epitaxial layer 1e, the P+ edge termination area 7 including a lower-layer P+ edge termination area 7a, a middle-layer P+ edge termination area 7b, an upper-layer P+ edge termination area 7c, and the like is provided so as to come in contact with the outer end portion of the active cell region 3. In the drawing, the portion enclosed in the broken line is a unit cell UC of the Vertical-Channel JFET, and the portion indicated by the arrow is a vertical channel portion VC.

FIG. 22 shows an enlarged top view of the local cut-away region R3 of the cell portion of FIG. 1. As shown in FIG. 22, a spacing B between the uppermost portions of the P+ gate regions is set larger than a spacing A (spacings between the adjacent lower-layer P+ gate regions 4a, between the adjacent middle-layer P+ gate regions 4b, and between the adjacent upper-layer P+ gate regions 4c which are individual components) between main portions 4m of the P+ gate regions.

Next, a description will be given to the relationship between the wafer 1 and the chip 2 in the middle of manufacturing based on FIG. 3. The SiC wafer 1 (the polytype of which is, e.g., 4H) has a diameter of, e.g., 76 mm (note that the diameter of the wafer may also be 100 mm, 150 mm, or a value other than those shown above). As the crystal plane of the main surface, e.g., a (0001) plane or a plane equivalent thereto is used. Note that the SiC wafer 1 having a main orientation flat 15 and a sub-orientation flat 16 is used herein, though the use thereof is arbitrary. The crystal orientation is such that the direction of the main orientation flat 15 is, e.g., a [1-100] direction, and a direction opposite to that of the sub-orientation flat 16 is, e.g., a [11-20] direction.

It will be appreciated that the crystal plane of the main surface 1a may be not only, e.g., the (0001) plane or a plane equivalent thereto, but also a (0001) plane having properties similar to those of the crystal planes shown above or a plane tilted by an angle of about not more than 10 degrees from a plane equivalent thereto in a given orientation. Examples of the direction in which the plane is tilted herein include a [1, 1, –2, 0] and the like.

2. Description of Main Process in Manufacturing Method of Normally-Off Power JFET of Above Embodiment of Present Invention (See Mainly FIGS. 2 to 4 and 20)

In the following process, a wafer temperature in ion implantation is, e.g., about 400° C. (relatively high temperature) when an ion species is nitrogen, but ion implantation is performed at, e.g., an ordinary temperature or a room temperature when an ion species is other than nitrogen. Note that the temperatures mentioned above are only exemplary, and temperatures (higher temperatures or a cooled state under 15° C.) other than those mentioned above are not to be excluded.

Figure 4:
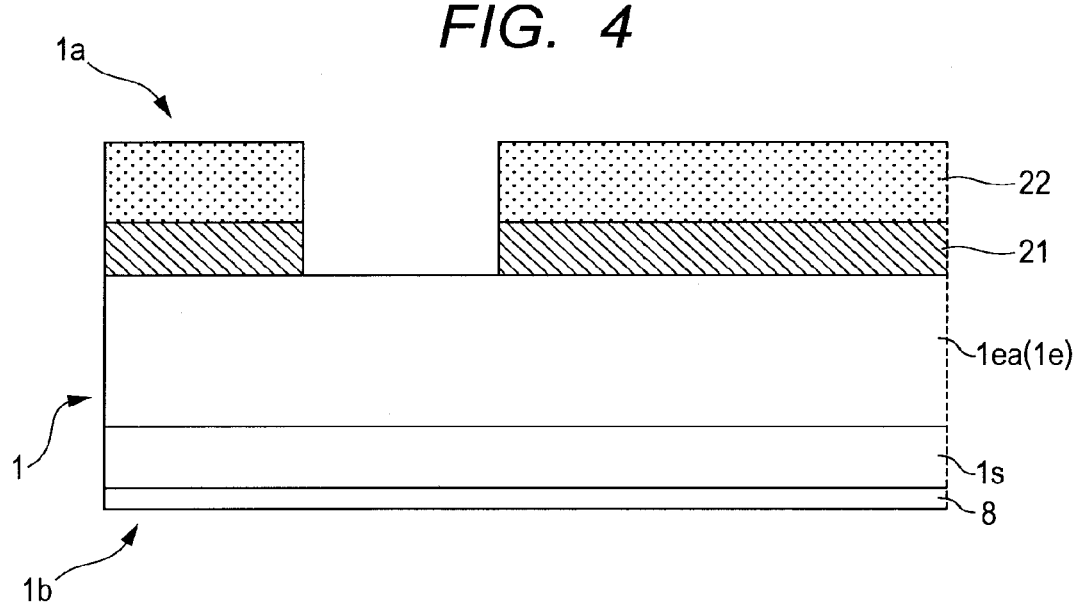
FIG. 4 is a device cross-sectional view corresponding to FIG. 2, which is for illustrating a main process (lithographic step for introducing a lower-layer P+ edge termination area) in the manufacturing method of the normally-off power JFET of the embodiment of the present invention.
Figure 5:
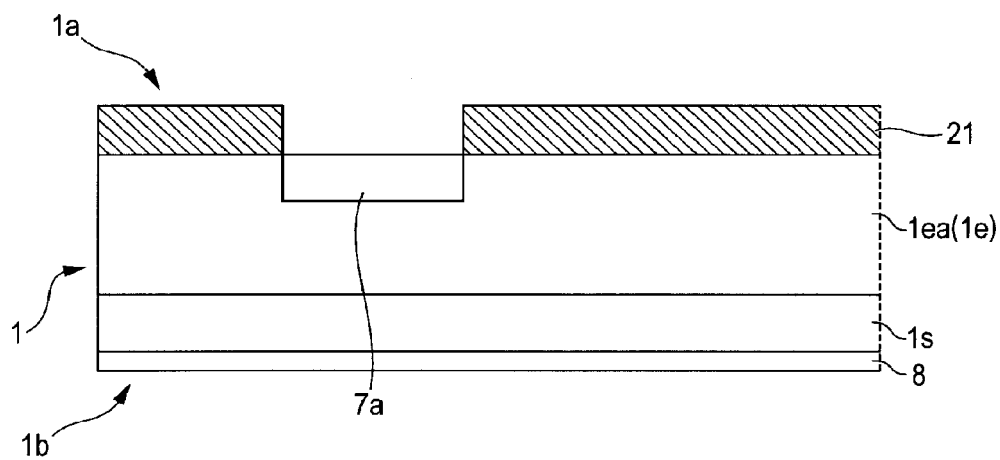
FIG. 5 is a device cross-sectional view corresponding to FIG. 2, which is for illustrating the main process (ion implantation step for introducing the lower-layer P+ edge termination area) in the manufacturing method of the normally-off power JFET of the embodiment of the present invention.
Figure 6:
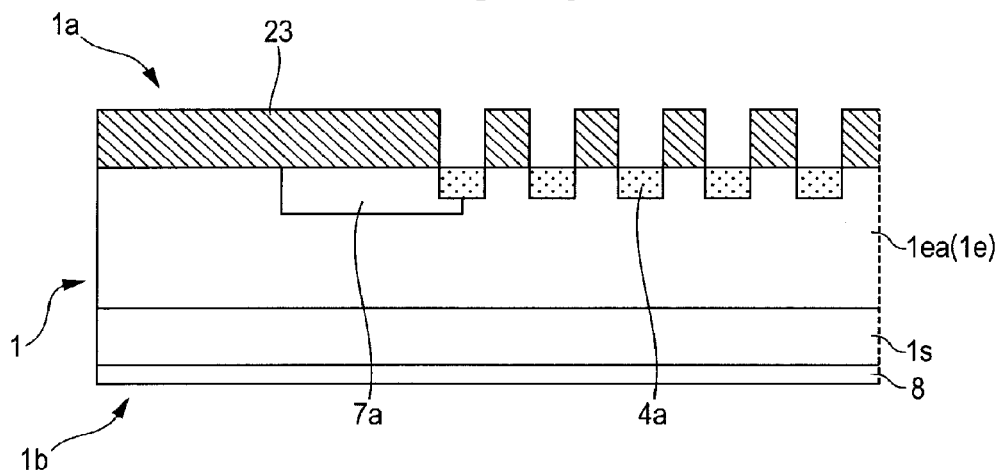
FIG. 6 is a device cross-sectional view corresponding to FIG. 2, which is for illustrating the main process (ion implantation step for introducing lower-layer P+ gate regions) in the manufacturing method of the normally-off power JFET of the embodiment of the present invention.
Figure 7:
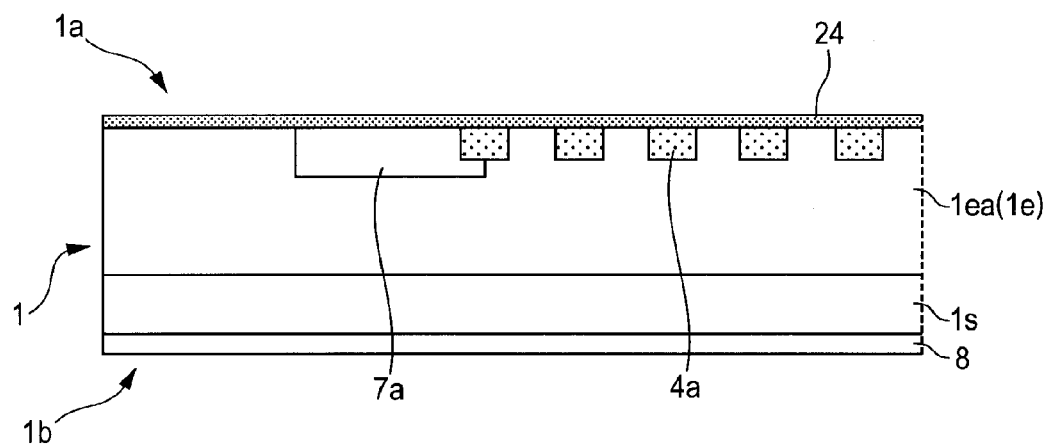
FIG. 7 is a device cross-sectional view corresponding to FIG. 2, which is for illustrating the main process (first activation annealing step) in the manufacturing method of the normally-off power JFET of the embodiment of the present invention.
Figure 8:
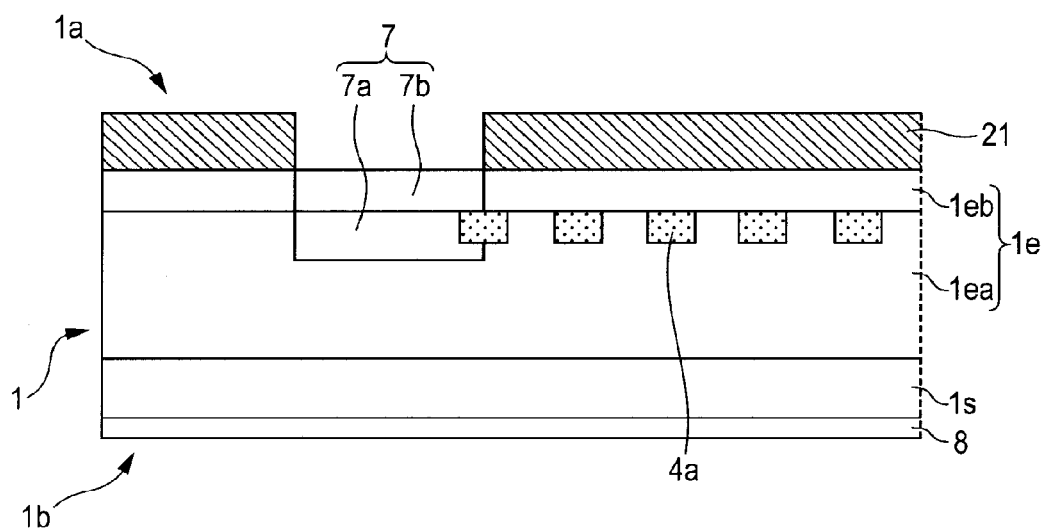
FIG. 8 is a device cross-sectional view corresponding to FIG. 2, which is for illustrating the main process (ion implantation step for introducing a middle-layer P+ edge termination area) in the manufacturing method of the normally-off power JFET of the embodiment of the present invention.
Figure 9:
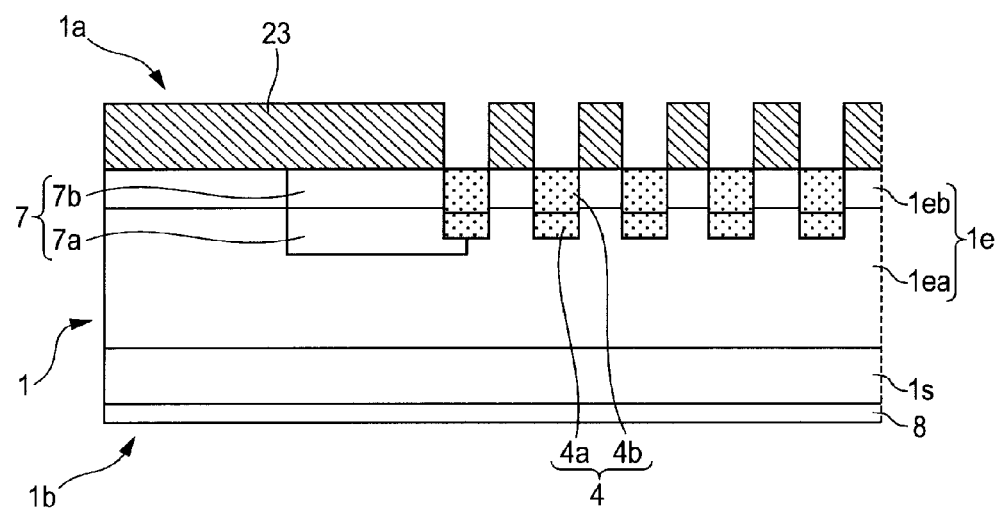
FIG. 9 is a device cross-sectional view corresponding to FIG. 2, which is for illustrating the main process (ion implantation step for introducing middle-layer P+ gate regions) in the manufacturing method of the normally-off power JFET of the embodiment of the present invention.
Figure 10:
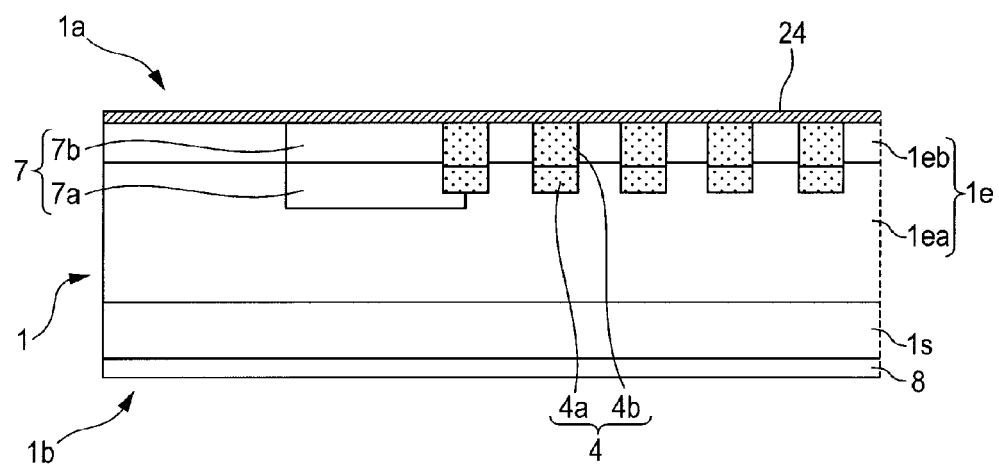
FIG. 10 is a device cross-sectional view corresponding to FIG. 2, which is for illustrating the main process (second activation annealing step) in the manufacturing method of the normally-off power JFET of the embodiment of the present invention.
Figure 11:
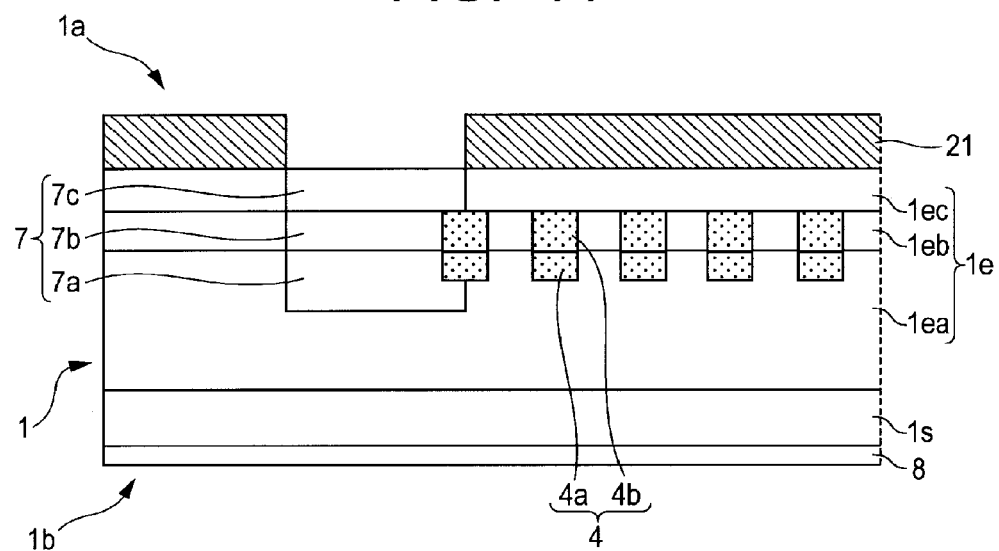
FIG. 11 is a device cross-sectional view corresponding to FIG. 2, which is for illustrating the main process (ion implantation step for introducing an upper-layer P+ edge termination area) in the manufacturing method of the normally-off power JFET of the embodiment of the present invention.
Figure 12:
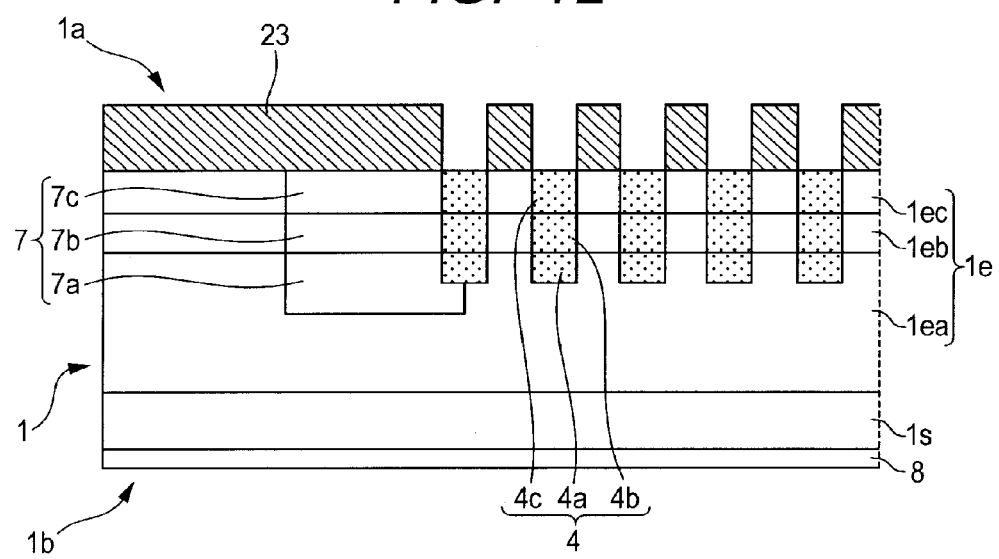
FIG. 12 is a device cross-sectional view corresponding to FIG. 2, which is for illustrating the main process (ion implantation step for introducing upper-layer P+ gate regions) in the manufacturing method of the normally-off power JFET of the embodiment of the present invention.
Figure 13:
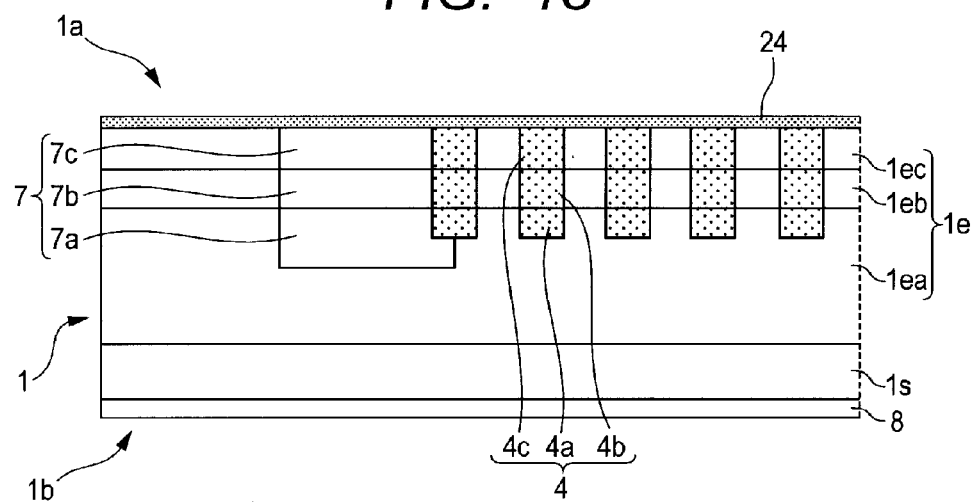
FIG. 13 is a device cross-sectional view corresponding to FIG. 2, which is for illustrating the main process (third activation annealing step) in the manufacturing method of the normally-off power JFET of the embodiment of the present invention.
Figure 14:
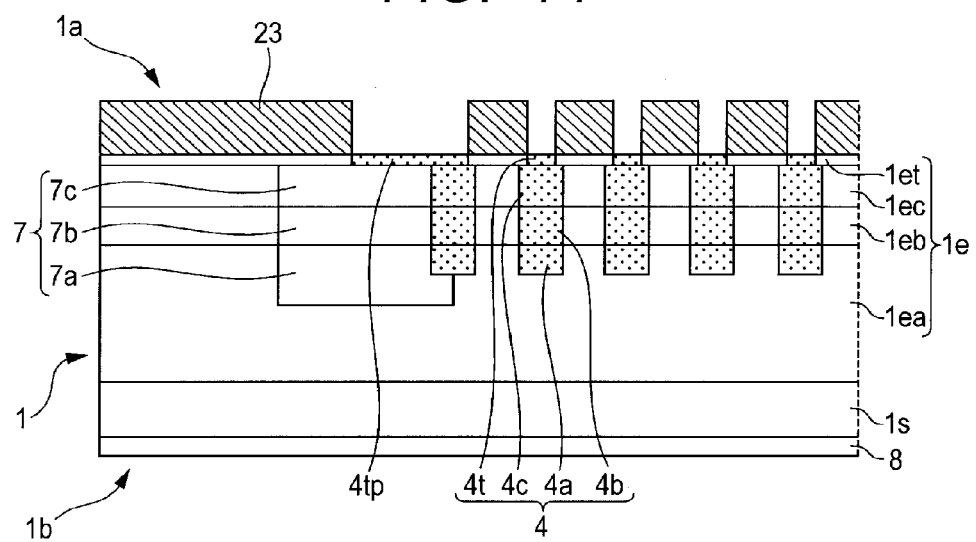
FIG. 14 is a device cross-sectional view corresponding to FIG. 2, which is for illustrating the main process (ion implantation step for introducing uppermost-layer P+ gate regions) in the manufacturing method of the normally-off power JFET of the embodiment of the present invention.
Figure 15:
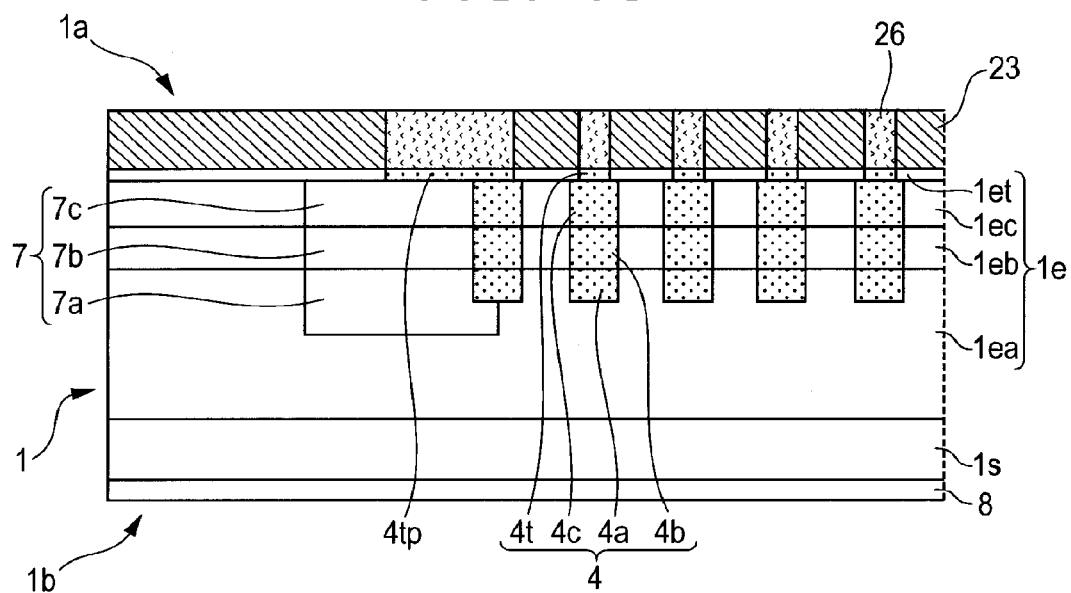
FIG. 15 is a device cross-sectional view corresponding to FIG. 2, which is for illustrating the main process (polysilicon film burying & planarization step) in the manufacturing method of the normally-off power JFET of the embodiment of the present invention.
Figure 16:
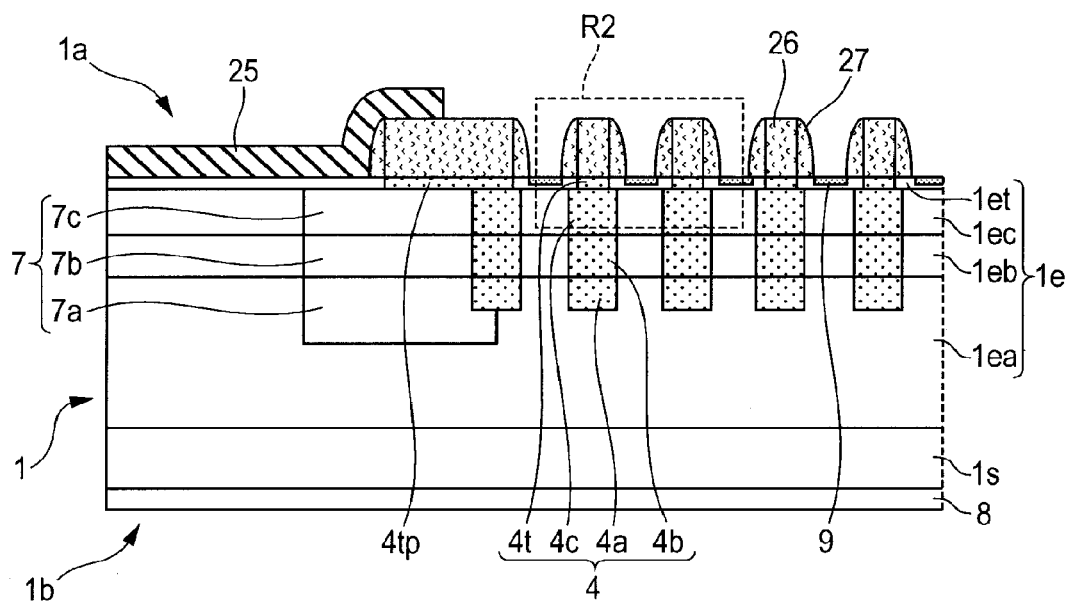
FIG. 16 is a device cross-sectional view corresponding to FIG. 2, which is for illustrating the main process (polysilicon sidewall forming & ion implantation step for introducing N+ source regions) in the manufacturing method of the normally-off power JFET of the embodiment of the present invention.
Figure 17:
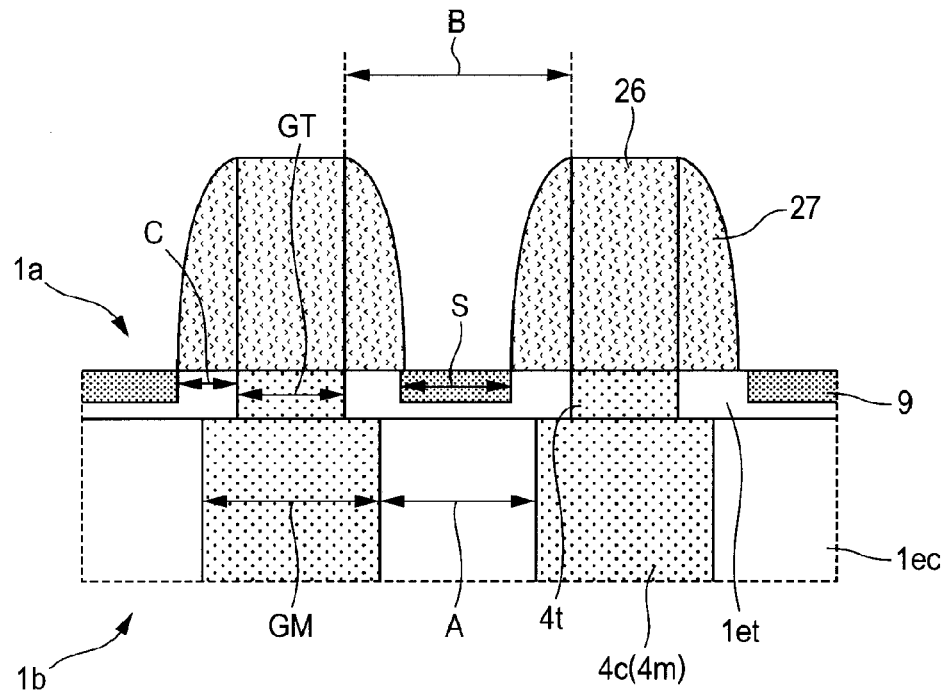
FIG. 17 is an enlarged cross-sectional view of a cut-away region R2 around the polysilicon sidewalls or the like of FIG. 16.
Figure 18:
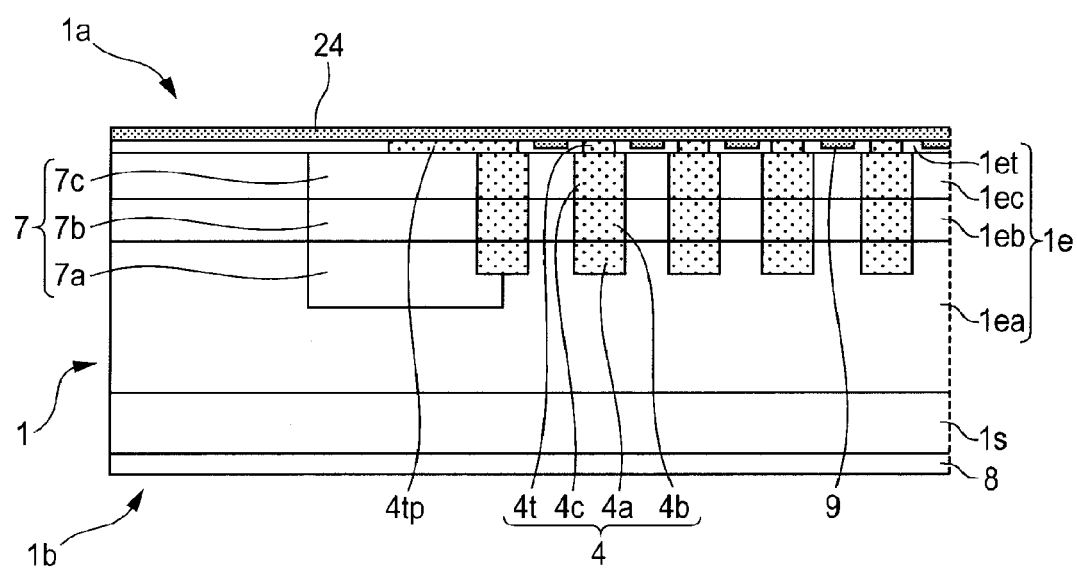
FIG. 18 is a device cross-sectional view corresponding to FIG. 2, which is for illustrating the main process (fourth activation annealing step) in the manufacturing method of the normally-off power JFET of the embodiment of the present invention.
Figure 19:
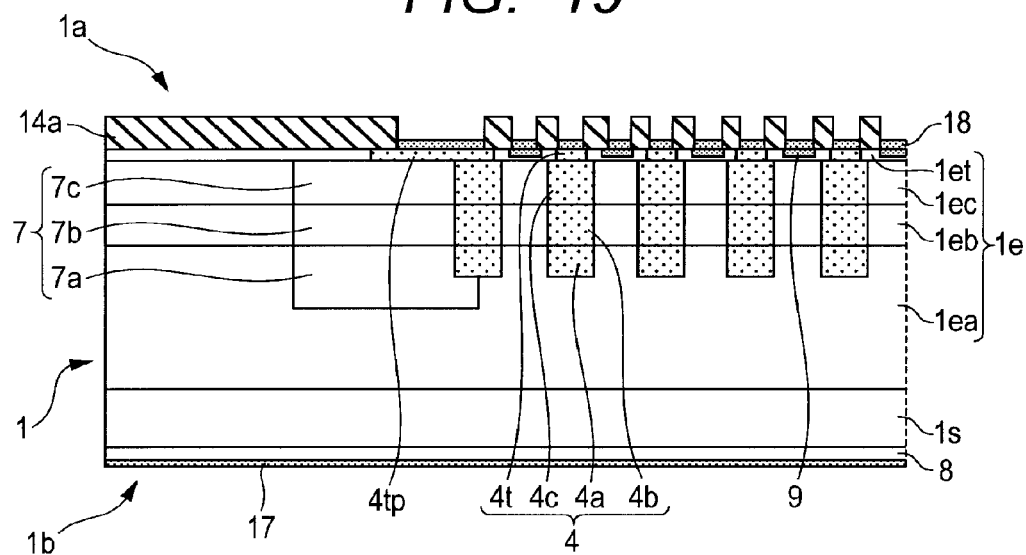
FIG. 19 is a device cross-sectional view corresponding to FIG. 2, which is for illustrating the main process (interlayer insulating film forming step) in the manufacturing method of the normally-off power JFET of the embodiment of the present invention.
Figure 20:
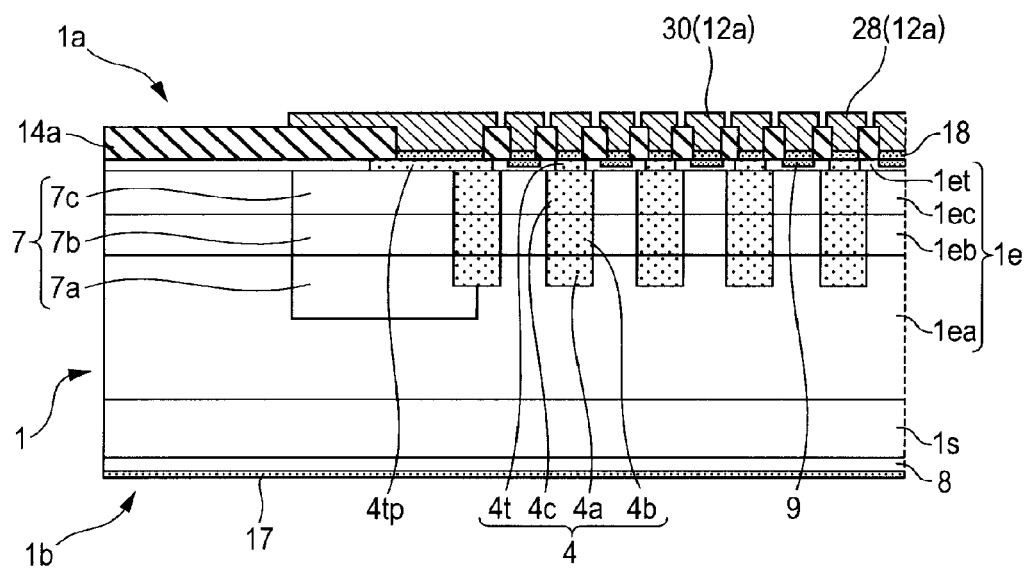
FIG. 20 is a device cross-sectional view corresponding to FIG. 2, which is for illustrating the main process (top-surface & back-surface silicide layer forming step) in the manufacturing method of the normally-off power JFET of the embodiment of the present invention.

FIG. 4 is a device cross-sectional view corresponding to FIG. 2, which is for illustrating a main process (lithographic step for introducing a lower-layer P+ edge termination area) in the manufacturing method of the normally-off power JFET of the embodiment of the present invention. FIG. 5 is a device cross-sectional view corresponding to FIG. 2, which is for illustrating the main process (ion implantation step for introducing the lower-layer P+ edge termination area) in the manufacturing method of the normally-off power JFET of the embodiment of the present invention. FIG. 6 is a device cross-sectional view corresponding to FIG. 2, which is for illustrating the main process (ion implantation step for introducing lower-layer P+ gate regions) in the manufacturing method of the normally-off power JFET of the embodiment of the present invention. FIG. 7 is a device cross-sectional view corresponding to FIG. 2, which is for illustrating the main process (first activation annealing step) in the manufacturing method of the normally-off power JFET of the embodiment of the present invention. FIG. 8 is a device cross-sectional view corresponding to FIG. 2, which is for illustrating the main process (ion implantation step for introducing a middle-layer P+ edge termination area) in the manufacturing method of the normally-off power JFET of the embodiment of the present invention. FIG. 9 is a device cross-sectional view corresponding to FIG. 2, which is for illustrating the main process (ion implantation step for introducing middle-layer P+ gate regions) in the manufacturing method of the normally-off power JFET of the embodiment of the present invention. FIG. 10 is a device cross-sectional view corresponding to FIG. 2, which is for illustrating the main process (second activation annealing step) in the manufacturing method of the normally-off power JFET of the embodiment of the present invention. FIG. 11 is a device cross-sectional view corresponding to FIG. 2, which is for illustrating the main process (ion implantation step for introducing an upper-layer P+ edge termination area) in the manufacturing method of the normally-off power JFET of the embodiment of the present invention. FIG. 12 is a device cross-sectional view corresponding to FIG. 2, which is for illustrating the main process (ion implantation step for introducing upper-layer P+ gate regions) in the manufacturing method of the normally-off power JFET of the embodiment of the present invention. FIG. 13 is a device cross-sectional view corresponding to FIG. 2, which is for illustrating the main process (third activation annealing step) in the manufacturing method of the normally-off power JFET of the embodiment of the present invention. FIG. 14 is a device cross-sectional view corresponding to FIG. 2, which is for illustrating the main process (ion implantation step for introducing uppermost-layer P+ gate regions) in the manufacturing method of the normally-off power JFET of the embodiment of the present invention. FIG. 15 is a device cross-sectional view corresponding to FIG. 2, which is for illustrating the main process (polysilicon film burying & planarization step) in the manufacturing method of the normally-off power JFET of the embodiment of the present invention. FIG. 16 is a device cross-sectional view corresponding to FIG. 2, which is for illustrating the main process (polysilicon sidewall forming & ion implantation step for introducing N+ source regions) in the manufacturing method of the normally-off power JFET of the embodiment of the present invention. FIG. 17 is an enlarged cross-sectional view of a cut-away region R2 around the polysilicon sidewalls or the like of FIG. 16. FIG. 18 is a device cross-sectional view corresponding to FIG. 2, which is for illustrating the main process (fourth activation annealing step) in the manufacturing method of the normally-off power JFET of the embodiment of the present invention. FIG. 19 is a device cross-sectional view corresponding to FIG. 2, which is for illustrating the main process (interlayer insulating film forming step) in the manufacturing method of the normally-off power JFET of the embodiment of the present invention. FIG. 20 is a device cross-sectional view corresponding to FIG. 2, which is for illustrating the main process (top-surface & back-surface silicide layer forming step) in the manufacturing method of the normally-off power JFET of the embodiment of the present invention. Based on these drawings, a description will be given to the main process in the manufacturing method of the normally-off power JFET of the embodiment of the present invention.

First, as described using FIG. 3, the N-type (first-conductivity-type) single-crystal SiC wafer 1 having a thickness of, e.g., about 700 μm (in a preferred range of, e.g., about 500 to 1000 μm) is prepared. The SiC wafer 1 has a resistivity of, e.g., about 20 mΩ·cm. Next, as shown in FIG. 3, by introducing an N-type impurity from the back surface 1b by, e.g., ion implantation, the N+ heavily doped drain layer 8 is formed. Preferred examples of conditions for the ion implantation that can be shown include an ion species of, e.g., nitrogen, a dose of, e.g., about $5 \times 10^{14}/cm^2$, and an implantation energy of, e.g., about 50 KeV. Thereafter, activation annealing is performed (e.g., in an inert gas atmosphere at 1650° C. for about 3 minutes).

Next, in substantially the entire top surface 1a of the wafer 1, the lower N− epitaxial layer 1ea (first silicon-carbide-based semiconductor epitaxial layer) having a thickness of, e.g., about 5 to 10 μm in accordance with a required breakdown voltage is formed by vapor-phase epitaxial growth. Examples of a concentration range of an N-type impurity (e.g., nitrogen) that can be shown include a range of, e.g., about $1 \times 10^{16}/cm^3$ to about $2 \times 10^{16}/cm^3$.

Next, over substantially the entire top surface 1a of the wafer 1, a silicon oxide film 21 for introducing the edge termination area having a thickness of, e.g., about 2000 nm is deposited by CVD (Chemical Vapor Deposition) using, e.g., TEOS (Tetraethoxysilane). Onto the silicon oxide film 21 for introducing the edge termination area, a resist film 22 for introducing the edge termination area is coated and patterned by typical lithography. Subsequently, using the patterned resist film 22 as a mask, the silicon oxide film 21 is subjected to an anisotropic dry etching treatment using, e.g., a fluorocarbon-based etching gas or the like to be patterned. Thereafter, the resist film 22 that is no longer needed is removed by ashing or the like.

Next, as shown in FIG. 5, using the patterned silicon oxide film 21 for introducing the edge termination area as a mask, ion implantation of a P-type impurity is performed as follows, thereby forming the lower-layer P+ edge termination area 7a having a depth of, e.g., about 0.7 μm. That is, each of the following steps is performed. For instance, as preferred examples of conditions for the ion implantation, the following combinations (1) to (5) can be shown.

(1) an ion species of, e.g., aluminum, a dose of, e.g., about $4 \times 10^{11}/cm^2$, and an implantation energy of, e.g., about 500 KeV (2) an ion species of, e.g., aluminum, a dose of, e.g., about $2 \times 10^{12}/cm^2$, and an implantation energy of, e.g., about 400 KeV (3) an ion species of, e.g., aluminum, a dose of, e.g., about $1 \times 10^{12}/cm^2$, and an implantation energy of, e.g., about 250 KeV (4) an ion species of, e.g., aluminum, a dose of, e.g., about $2 \times 10^{12}/cm^2$, and an implantation energy of, e.g., about 100 KeV (5) an ion species of, e.g., aluminum, a dose of, e.g., about $3 \times 10^{12}/cm^2$, and an implantation energy of, e.g., about 50 KeV Thereafter, the silicon oxide film 21 for introducing the edge termination area that is no longer needed is removed using, e.g., a hydrofluoric-acid-based etching solution for silicon oxide film.

Next, as shown in FIG. 6, over substantially the entire top surface 1a of the wafer 1, by CVD using, e.g., TEOS or the like, a silicon oxide film 23 for introducing the P+ gate regions having a thickness of, e.g., about 1500 nm is deposited. Subsequently, in the same manner as described above, the silicon oxide film 23 for introducing the P+ gate regions is patterned and, using the patterned silicon oxide film 23 as a mask, ion implantation of a P-type (second-conductivity-type) impurity is performed as follows, thereby forming the lower-layer P+ gate regions 4a (first gate impurity regions) each having a depth of; e.g., about 0.2 μm. That is, each of the following steps is performed. For instance, as preferred examples of conditions for the ion implantation, the following combinations (1) to (3) can be shown.

(1) an ion species of, e.g., aluminum, a dose of, e.g., about $6 \times 10^{14}/cm^2$, and an implantation energy of, e.g., about 150 KeV (2) an ion species of, e.g., aluminum, a dose of, e.g., about $5 \times 10^{14}/cm^2$, and an implantation energy of, e.g., about 75 KeV (3) an ion species of, e.g., aluminum, a dose of, e.g., about $3 \times 10^{14}/cm^2$, and an implantation energy of, e.g., about 50 KeV Thereafter, the silicon oxide film 23 that is no longer needed is removed using, e.g., a hydrofluoric-acid-based etching solution for silicon oxide film.

Next, as shown in FIG. 7, over substantially the entire top surface 1a of the wafer 1, a carbon film 24 (carbon-based film) having a thickness of, e.g., about 100 nm is deposited by, e.g., plasma CVD or the like. Preferred examples of conditions for the deposition that can be shown include a gas flow rate of, e.g., $CH_4/Ar$=about 1000 sccm/about 100 sccm, a processing pressure of, e.g., about 1 kPa, a high-frequency power of, e.g., about 1 kW, and the like.

Next, over substantially the entire top surface $1a$ of the wafer 1 in a state where the carbon film 24 is formed, activation annealing (first activation annealing) is performed. Preferred examples of conditions for the activation annealing that can be shown include a processing atmosphere of, e.g., an inert gas atmosphere, a processing temperature of, e.g., about 1650° C., and a processing time of, e.g., about 3 minutes. Thereafter, the carbon film 24 that is no longer needed is removed by $O_2$ plasma ashing or the like.

Next, as shown in FIG. 8, over substantially the entire top surface $1a$ of the wafer 1, the middle-layer P+ gate regions $4b$ (second gate impurity regions) each having a thickness of, e.g., about 0.5 μm are formed by vapor-phase epitaxial growth. Examples of a preferred concentration range of an N-type impurity (e.g., nitrogen) that can be shown include, e.g., about $1\times10^{16}/cm^3$.

Next, in the same manner as described above, the silicon oxide film 21 for introducing the edge termination area is patterned and, using the patterned silicon oxide film 21 for introducing the edge termination area as a mask, ion implantation of a P-type impurity is performed as follows, thereby forming the middle-layer P+ edge termination area $7b$ having a depth of, e.g., about 0.5 μm. That is, each of the following steps is performed. For instance, as preferred examples of conditions for the ion implantation, the following combinations (1) to (4) can be shown.

(1) an ion species of, e.g., aluminum, a dose of, e.g., about $2\times10^{12}/cm^2$, and an implantation energy of, e.g., about 400 KeV (2) an ion species of, e.g., aluminum, a dose of, e.g., about $1\times10^{12}/cm^2$, and an implantation energy of, e.g., about 250 KeV (3) an ion species of, e.g., aluminum, a dose of, e.g., about $2\times10^{12}/cm^2$, and an implantation energy of, e.g., about 100 KeV (4) an ion species of, e.g., aluminum, a dose of, e.g., about $3\times10^{12}/cm^2$, and an implantation energy of, e.g., about 50 KeV Thereafter, the silicon oxide film 21 for introducing the edge termination area that is no longer needed is removed using, e.g., a hydrofluoric-acid-based etching solution for silicon oxide film.

Next, as shown in FIG. 9, over substantially the entire top surface $1a$ of the wafer 1, by CVD using, e.g., TEOS or the like, the silicon oxide film 23 for introducing the P+ gate regions having a thickness of, e.g., about 1500 nm is deposited. Subsequently, in the same manner as described above, the silicon oxide film 23 for introducing the P+ gate regions is patterned and, using the patterned silicon oxide film 23 as a mask, ion implantation of a P-type impurity is performed as follows, thereby forming the middle-layer P+ gate regions $4b$ (second gate impurity regions) each having a depth of, e.g., about 0.5 μm. That is, each of the following steps is performed. For instance, as preferred examples of conditions for the ion implantation, the following combinations (1) to (4) can be shown.

(1) an ion species of, e.g., aluminum, a dose of, e.g., about $1\times10^{14}/cm^2$, and an implantation energy of, e.g., about 400 KeV (2) an ion species of, e.g., aluminum, a dose of, e.g., about $5\times10^{14}/cm^2$, and an implantation energy of, e.g., about 250 KeV (3) an ion species of, e.g., aluminum, a dose of, e.g., about $5\times10^{14}/cm^2$, and an implantation energy of, e.g., about 100 KeV (4) an ion species of, e.g., aluminum, a dose of, e.g., about $3\times10^{14}/cm^2$, and an implantation energy of, e.g., about 50 KeV Thereafter, the silicon oxide film 23 that is no longer needed is removed using, e.g., a hydrofluoric-acid-based etching solution for silicon oxide film.

Next, as shown in FIG. 10, in the same manner as described above, the carbon film 24 (carbon-based film) having a thickness of, e.g., about 100 nm is deposited over substantially the entire top surface $1a$ of the wafer 1 by, e.g., plasma CVD or the like. Next, in the same manner as described above, on substantially the entire top surface $1a$ of the wafer 1 in a state where the carbon film 24 is formed, activation annealing (second activation annealing) is performed. Thereafter, the carbon film 24 that is no longer needed is removed by $O_2$ plasma ashing or the like.

Next, as shown in FIG. 11, over substantially the entire top surface $1a$ of the wafer 1, the upper-layer P+ gate region $4c$ having a thickness of, e.g., about 0.5 μm is formed by vapor-phase epitaxial growth. Examples of a preferred concentration range of an N-type impurity (e.g., nitrogen) that can be shown include, e.g., about $1\times10^{16}/cm^3$.

Next, in the same manner as described above, the silicon oxide film 21 for introducing the edge termination area is patterned and, using the patterned silicon oxide film 21 for introducing the edge termination area as a mask, ion implantation of a P-type impurity is performed as follows, thereby forming the upper-layer P+ edge termination area $7c$ having a depth of, e.g., about 0.5 μm. That is, each of the following steps is performed. For instance, as preferred examples of conditions for the ion implantation, the following combinations (1) to (4) can be shown.

(1) an ion species of, e.g., aluminum, a dose of, e.g., about $2\times10^{12}/cm^2$, and an implantation energy of, e.g., about 400 KeV (2) an ion species of, e.g., aluminum, a dose of, e.g., about $1\times10^{12}/cm^2$, and an implantation energy of, e.g., about 250 KeV (3) an ion species of, e.g., aluminum, a dose of, e.g., about $2\times10^{12}/cm^2$, and an implantation energy of, e.g., about 100 KeV (4) an ion species of, e.g., aluminum, a dose of, e.g., about $3\times10^{12}/cm^2$, and an implantation energy of, e.g., about 50 KeV Thereafter, the silicon oxide film 21 for introducing the edge termination area that is no longer needed is removed using, e.g., a hydrofluoric-acid-based etching solution for silicon oxide film.

Next, as shown in FIG. 12, over substantially the entire top surface $1a$ of the wafer 1, by CVD using, e.g., TEOS or the like, the silicon oxide film 23 for introducing the P+ gate regions having a thickness of, e.g., about 1500 nm is deposited. Subsequently, in the same manner as described above, the silicon oxide film 23 for introducing the P+ gate regions is patterned and, using the patterned silicon oxide film 23 as a mask, ion implantation of a P-type impurity is performed as follows, thereby forming the upper-layer P+ gate regions $4c$ each having a depth of, e.g., about 0.5 μm. That is, each of the following steps is performed. For instance, as preferred examples of conditions for the ion implantation, the following combinations (1) to (4) can be shown.

(1) an ion species of, e.g., aluminum, a dose of, e.g., about $1\times10^{14}/cm^2$, and an implantation energy of, e.g., about 400 KeV (2) an ion species of, e.g., aluminum, a dose of, e.g., about $5×10^{14}/cm^2$, and an implantation energy of, e.g., about 250 KeV (3) an ion species of, e.g., aluminum, a dose of, e.g., about $5×10^{14}/cm^2$, and an implantation energy of, e.g., about 100 KeV (4) an ion species of, e.g., aluminum, a dose of, e.g., about $3×10^{14}/cm^2$, and an implantation energy of, e.g., about 50 KeV Thereafter, the silicon oxide film 23 that is no longer needed is removed using, e.g., a hydrofluoric-acid-based etching solution for silicon oxide film.

Next, as shown in FIG. 13, in the same manner as described above, the carbon film 24 having a thickness of, e.g., about 100 nm is deposited over substantially the entire top surface 1a of the wafer 1 by, e.g., plasma CVD or the like. Next, in the same manner as described above, on substantially the entire top surface 1a of the wafer 1, activation annealing is performed in a state where the carbon film 24 is formed. Thereafter, the carbon film 24 that is no longer needed is removed by $O_2$ plasma ashing or the like.

Next, as shown in FIG. 14, over substantially the entire top surface 1a of the wafer 1, by CVD using, e.g., TEOS or the like, the silicon oxide film 23 for introducing the P+ gate regions having a thickness of, e.g., about 500 nm is deposited. Subsequently, in the same manner as described above, the silicon oxide film 23 for introducing the P+ gate regions is patterned and, using the patterned silicon oxide film 23 as a mask, ion implantation of a P-type impurity is performed as follows, thereby forming the uppermost-layer $P_+$ gate regions 4t (third gate impurity regions or uppermost portions of the $P_+$ gate regions) each having a depth of, e.g., about 0.2 µm. That is, each of the following steps is performed. For instance, as preferred examples of conditions for the ion implantation, the following combinations (1) to (4) can be shown.

(1) an ion species of, e.g., aluminum, a dose of, e.g., about $2×10^{14}/cm^2$, and an implantation energy of, e.g., about 200 KeV (2) an ion species of, e.g., aluminum, a dose of, e.g., about $3×10^{14}/cm^2$, and an implantation energy of, e.g., about 100 KeV (3) an ion species of, e.g., aluminum, a dose of, e.g., about $5×10^{14}/cm^2$, and an implantation energy of, e.g., about 50 KeV (4) an ion species of, e.g., aluminum, a dose of, e.g., about $7×10^{14}/cm^2$, and an implantation energy of, e.g., about 30 KeV Thereafter, the silicon oxide film 23 that is no longer needed is removed using, e.g., a hydrofluoric-acid-based etching solution for silicon oxide film.

Next, as shown in FIG. 15, over substantially the entire top surface 1a of the wafer 1, a polysilicon film 26 having a thickness of, e.g., about 1000 nm is deposited by, e.g., CVD or the like. Next, surface planarization is performed by, e.g., CMP (Chemical Mechanical Polishing) or the like, thereby removing the polysilicon film 26 over the silicon oxide film 23 for introducing the P+ gate regions. Thereafter, the silicon oxide film 23 is removed using, e.g., a hydrofluoric-acid-based etching solution for silicon oxide film.

Next, as shown in FIG. 16, over substantially the entire top surface 1a of the wafer 1, a polysilicon film 27 having a thickness of, e.g., about 200 nm is deposited by, e.g., CVD or the like. Subsequently, an etch-back process is performed by anisotropic dry etching using, e.g., a chlorine/oxygen-based etching gas to form the polysilicon film sidewalls 27. Then, in a state where the region other than the active cell region 3 is covered with a silicon oxide film 25 for introducing the N+ source regions having a thickness of, e.g., about 300 nm, using the silicon oxide film 25 as a mask, ion implantation of an N-type impurity is performed as follows, thereby forming the N+ source regions 9 each having a depth of, e.g., about 0.1 µm. That is, each of the following steps is performed. For instance, as preferred examples of conditions for the ion implantation, the following combinations (1) to (3) can be shown.

(1) an ion species of, e.g., nitrogen, a dose of, e.g., about $5×10^{14}/cm^2$, and an implantation energy of, e.g., about 100 KeV (2) an ion species of, e.g., nitrogen, a dose of, e.g., about $5×10^{14}/cm^2$, and an implantation energy of, e.g., about 75 KeV (3) an ion species of, e.g., nitrogen, a dose of, e.g., about $5×10^{14}/cm^2$, and an implantation energy of, e.g., about 50 KeV Thereafter, the silicon oxide film 25 that is no longer needed is removed using, e.g., a hydrofluoric-acid-based etching solution for silicon oxide film.

FIG. 17 shows an enlarged cross-sectional view of the cut-away region R2 around the polysilicon sidewalls or the like of FIG. 16. FIG. 17 also shows an example of the dimensions of the individual portions. That is, the spacing A between the main portions 4m of the P+ gate regions is, e.g., about 1.1 µm, the spacing B between the uppermost portions 4t of the P+ gate regions is, e.g., about 0.9 µm, a source-gate spacing C is, e.g., about 0.2 µm, a width GM of each of the main portions of the gate regions is, e.g., about 1.1 µm, a width GT of each of the uppermost portions of the gate regions is, e.g., about 0.9 µm, and a width S of each of the source regions is, e.g., about 0.9 µm.

Next, after removal of the silicon oxide film 25 by wet etching or the like, through wet etching using, e.g., a hydrofluoric/nitric acid (aqueous mixed solution of a hydrofluoric acid and a nitric acid) or the like, the polysilicon film 26 and the polysilicon film sidewalls 27 are removed.

Next, as shown in FIG. 18, in the same manner as described above, the carbon film 24 (carbon-based film) having a thickness of, e.g., about 100 nm is deposited over substantially the entire top surface 1a of the wafer 1 by, e.g., plasma CVD or the like. Next, on substantially the entire top surface 1a of the wafer 1 in a state where the carbon film 24 is formed, activation annealing (third activation annealing) is performed (e.g., in an inert gas atmosphere at 1800° C. for about 30 seconds). Thereafter, the carbon film 24 that is no longer needed is removed by $O_2$ plasma ashing or the like. Note that, as necessary, back grinding or the like is performed.

Next, as shown in FIG. 19, over substantially the entire top surface 1a of the wafer 1, the lower-layer interlayer insulating film 14a having a thickness of, e.g., about 500 nm is deposited by CVD using, e.g., TEOS or the like. Then, over substantially the entire back surface 1b of the wafer 1, a nickel film (having a thickness of, e.g., about 50 nm) is formed by, e.g., sputtering deposition. Subsequently, by typical lithography, gate and source contact holes are opened in the lower-layer interlayer insulating film 14a. Then, over substantially the entire top surface 1a of the wafer 1, a nickel film (having a thickness of, e.g., about 50 nm) is formed by, e.g., sputtering deposition, and primary silicidation annealing is performed (e.g., in an inert gas atmosphere at 600° C. for about 60 minutes). Subsequently, by dipping the wafer 1 in an aqueous mixed solution of a sulfuric acid and a hydrogen peroxide, the nickel films remaining on the top and back of the wafer 1 are removed. Thereafter, secondary silicidation annealing is performed (e.g., in an inert gas atmosphere at 1000° C. for about 30 seconds) to form the top-surface nickel silicide films 18 and the back-surface nickel silicide film 17.

Next, as shown in FIG. 20, over substantially the entire top surface 1a of the wafer 1, the lower metal electrode layer 12a successively including a tantalum film (having a thickness of, e.g., about 50 nm), a tantalum nitride film (having a thickness of, e.g., about 100 nm), an aluminum-based metal film (having a thickness of, e.g., about 500 nm), and the like is deposited by, e.g., sputtering deposition. Subsequently, the lower metal electrode layer 12a is patterned by typical lithography to form the gate lead-out metal wires 28, the source lead-out metal wires 30, and the like.

Next, as shown in FIG. 2, over substantially the entire top surface 1a of the wafer 1, the upper-layer interlayer insulating film 14b having a thickness of, e.g., about 500 nm is deposited by CVD using, e.g., TEOS or the like. Subsequently, by typical lithography, interconnection holes are opened in the upper-layer interlayer insulating film 14b. Then, over substantially the entire top surface 1a of the wafer 1, the upper metal electrode layer 12b successively including a titanium film (having a thickness of, e.g., about 50 nm), a titanium nitride film (having a thickness of, e.g., about 100 nm), an aluminum-based metal film (having a thickness of, e.g., about 500 nm), and the like is deposited by, e.g., sputtering deposition. Subsequently, the upper-layer interlayer insulating film 14b is patterned by typical lithography to form the metal source electrode 5, the metal gate electrodes 6, and the like. Thereafter, as necessary, a final passivation film such as a polyimide film or the like is formed. Then, over substantially the entire back surface 1b of the wafer 1, the back-surface metal drain electrode 10 (including, e.g., titanium, nickel, gold, and the like which are shown in order of increasing distance from the back surface) is formed by, e.g., sputtering deposition or the like. Thereafter, the wafer 1 is divided into the chips 2 by dicing or the like.

3. Description of Variation of Two-Dimensional Structure of Target Device, etc. in Manufacturing Method of Normally-Off Power JFET of Embodiment of Present Invention (See Mainly FIGS. 21 and 23)

The device structure described in Section 1 relates to the linear gate regions but, in the example of the present section, the gate regions over the dots are arranged in a substantially tetragonal lattice configuration. The structure has the advantage of a high area efficiency. Note that a method for extracting the gates and the sources shown in FIG. 24 is the substantially the same as in Section 1, and therefore the description thereof will not be repeated.

Figure 21:
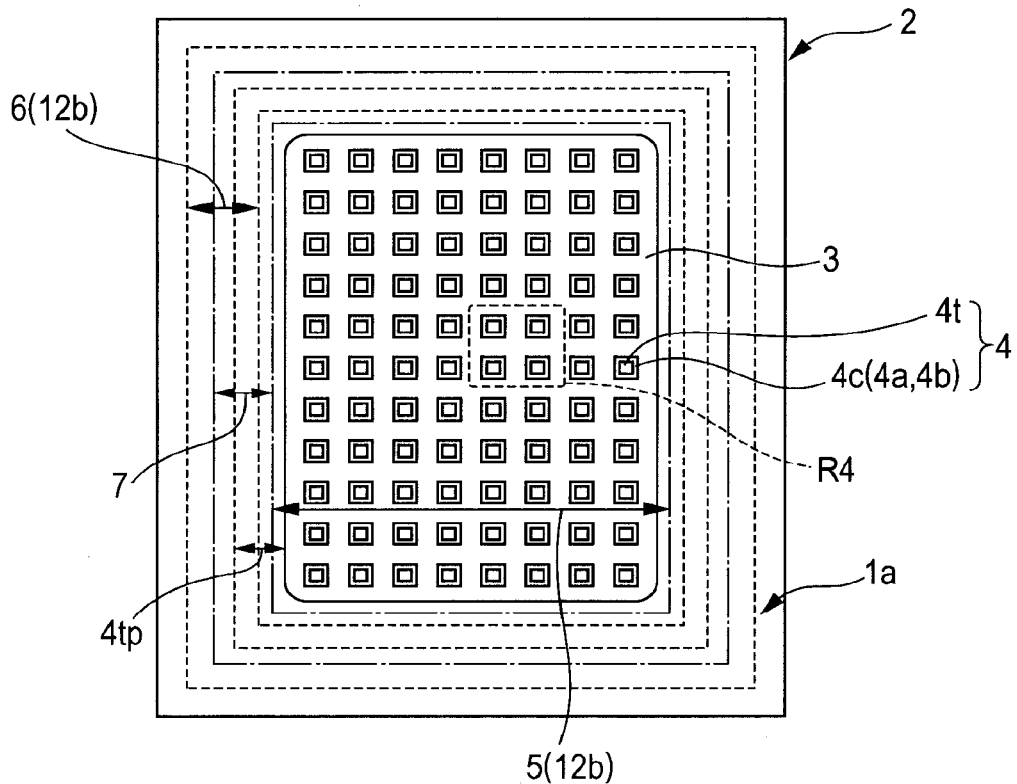
FIG. 21 is a chip top view of a variation of the target device in the manufacturing method of the normally-off power JFET of the embodiment of the present invention.
Figure 23:
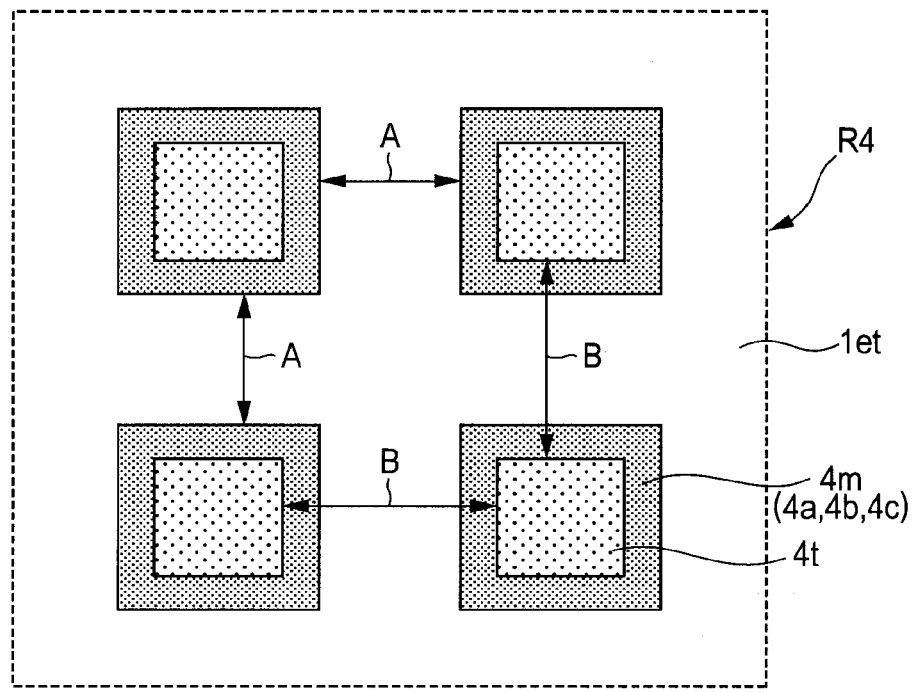
FIG. 23 is an enlarged plan view of a local cut-away region R4 of the cell portion of FIG. 21.

FIG. 21 is a chip top view of a variation of the target device in the manufacturing method of the normally-off power JFET of the embodiment of the present invention. FIG. 23 is an enlarged plan view of a local cut-away region R4 of the cell portion of FIG. 21. Based on these drawings, a description will be given to a variation of a two-dimensional structure of the target device and so forth in the manufacturing method of the normally-off power JFET of the foregoing embodiment of the present invention.

As shown in FIG. 21, the basic structure is substantially the same as in FIG. 1, but is different in that, while the two-dimensional structures of the P+ gate regions 4 in the example of FIG. 1 show elongated rectangular shapes (linear shapes), those in this example show substantially square dot shapes and are arranged in a matrix configuration forming a substantially tetragonal lattice. FIG. 23 shows an enlarged top view of the local cut-away region R4 of the cell portion of FIG. 21. In the same manner as in FIG. 22, the spacing B between the uppermost portions of the P+ gate regions is larger than the spacing A between the main portions of the P+ gate regions.

4. Supplemental Description of Above Embodiment (Including Variation) of Present Invention, etc. and Consideration to Every Aspect thereof (See Mainly FIGS. 2, 17, 22, 24, etc.)

In a silicon-based semiconductor such as silicon in which an impurity diffusion speed is relatively high, a multi-epitaxial treatment which repeats high-temperature epitaxial growth, ion implantation, and a high-temperature activation annealing treatment is not considered to be preferable in that lateral precision is required thereof. However, in a SIC-based semiconductor, the impurity diffusion speed is significantly low so that, even when a high-temperature processing cycle is repeated a plurality of times, a reduction in precision and increases in the dimensions of graphical figures do not present serious problems. Therefore, in a SIC-based semiconductor, if a gate pattern is defined using a mask for a multi-epitaxial treatment, high-precision gate regions can be easily defined.

To produce a normally-off element, the spacing between gate regions should not be more than a specified dimension and variations in the spacings between the plurality of gate regions need to be reduced. In addition, since it is necessary to place a large number of source regions between the gate regions, the spacing between the gate regions in the surface area of a substrate should not be less than a specified dimension. To satisfy such contradictory requirements, in the foregoing embodiment, the spacing between the main portions 4m of the P+ gate regions is set relatively small to ensure a reliable normally-off operation, while the spacing between the uppermost-layer P+ gate regions 4t (top gate portions) as the surface portions thereof is set relatively large since it is sufficient to ensure only the electrode extracting function. Accordingly, it is possible to provide a sufficient space where the source regions 9 are placed. For the same reason, the spacing between the gate region and the source region is also sufficiently large so that it is easy to prevent a leakage increase resulting from the contact between the two regions.

On the other hand, in a typical manufacturing method, it is necessary to use ion implantation using an extremely high energy (e.g., about 2 MeV) for the production of an edge termination structure using junctions. However, if the production is performed using each of the steps of a multi-epitaxial treatment, by stacking relatively thin junctions for individual epitaxial layers, the production is possible by only performing an ion implantation treatment using a normal-level implantation energy (e.g., about 700 KeV at most).

When source lead-out wires and gate lead-out wires are formed not over a portion having significant roughness due to trenches, but over a relatively planar substrate surface as in the foregoing embodiment, backing wiring using a metal can be used relatively easily so that it is easy to reduce the gate resistance or the like.

5. Summary

While the invention achieved by the present inventors has been specifically described heretofore based on the embodiment thereof, the present invention is not limited thereto. It will be appreciated that various changes and modifications can be made in the invention within the scope not departing from the gist thereof.

For example, in the foregoing embodiment, the specific description has been given mainly to the N-channel power JFET, but the present invention is not limited thereto. It will be appreciated that the present invention is also applicable to a P-channel power JFET. Also, in the foregoing embodiment, the specific description has been given mainly to the normally-off power JFET, but the present invention is not limited thereto. It will be appreciated that the present invention is also applicable to a normally-on power JFET. Also, in the foregoing embodiment, the specific description has been given mainly to the power JFET, but the present invention is not limited thereto. It will be appreciated that the present invention is also applicable to a power MISFET (Metal Insulator Semiconductor Field Effect Transistor) or MOSFET (Metal Oxide Semiconductor Field Effect Transistor). Also, in the foregoing embodiment, the specific description has been given mainly to the active device (such as FET, IGBT, or diode) using the silicon-carbide-based semiconductor substrate (the polytype of which is not limited to 4H, and may also be another) such as SIC, but the present invention is not limited thereto. It will be appreciated that the present invention is also applicable to a GaN-based active device.

What is claimed is:

1. A power JFET, comprising:
a silicon-carbide-based semiconductor substrate having a first main surface having a first conductivity type, the silicon-carbide-based semiconductor substrate including:
a first silicon-carbide-based semiconductor epitaxial layer having the same conductivity type as the first conductivity type and a concentration lower than that of the silicon-carbide-based semiconductor substrate;
a second silicon-carbide-based semiconductor epitaxial layer having the same conductivity type as the first conductivity type and a concentration lower than that of the semiconductor substrate and provided in a surface of the first silicon-carbide-based semiconductor epitaxial layer corresponding to the first main surface of the semiconductor wafer;
a plurality of first gate impurity regions doped with an impurity having a second conductivity type and provided in the first silicon-carbide-based semiconductor epitaxial layer; and
a plurality of second gate impurity regions doped with an impurity having the second conductivity type and provided in the second silicon-carbide-based semiconductor epitaxial layer,
wherein the first gate impurity regions and the second gate impurity regions are continuously aligned.

2. A power JFET according to claim 1,
wherein the first gate impurity regions are formed by doping the surface of the first silicon-carbide-based semiconductor epitaxial layer with the impurity having the second conductivity type by ion implantation and performing first activation annealing thereon, and
wherein the second gate impurity regions are formed by doping a surface of the second silicon-carbide-based semiconductor epitaxial layer with the impurity having the second conductivity type by ion implantation and performing second activation annealing thereon.

3. A power JFET according to claim 2,
wherein the first activation annealing and the second activation annealing are each performed in a state where the first main surface of the semiconductor wafer is covered with a carbon-based film.

* * * * *